United States Patent
Colinge et al.

(10) Patent No.: US 10,134,918 B2
(45) Date of Patent: Nov. 20, 2018

(54) MEMORY DEVICE AND METHOD FOR FABRICATING THE SAME

(71) Applicant: Taiwan Semiconductor Manufacturing Company, Ltd., Hsinchu (TW)

(72) Inventors: Jean-Pierre Colinge, Hsinchu (TW); Ta-Pen Guo, Taipei (TW); Carlos H. Diaz, Mountain View, CA (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/596,733

(22) Filed: May 16, 2017

(65) Prior Publication Data

US 2017/0250288 A1    Aug. 31, 2017

Related U.S. Application Data

(62) Division of application No. 14/279,842, filed on May 16, 2014, now Pat. No. 9,673,209.

(51) Int. Cl.
*H01L 29/788* (2006.01)
*H01L 27/11521* (2017.01)
(Continued)

(52) U.S. Cl.
CPC .......... *H01L 29/7889* (2013.01); *B82Y 10/00* (2013.01); *H01L 21/28273* (2013.01);
(Continued)

(58) Field of Classification Search
CPC .......... H01L 21/28282; H01L 29/7883; H01L 29/66825; H01L 29/7889; H01L 27/11519;
(Continued)

(56) References Cited

U.S. PATENT DOCUMENTS

| | | |
|---|---|---|
| 6,034,389 A | 3/2000 | Burns, Jr. et al. |
| 2006/0011972 A1 | 1/2006 | Graham et al. |

(Continued)

FOREIGN PATENT DOCUMENTS

| | | |
|---|---|---|
| CN | 1265466 C | 7/2006 |
| CN | 101410963 A | 4/2009 |

(Continued)

OTHER PUBLICATIONS

Ahn, Y., et al., "A New EEPROM with Side Floating Gates Having Different Work Function from Control Gate," Journal of Semiconductor Technology and Science, vol. 2, No. 3, Sep. 2002, pp. 157-163.

(Continued)

*Primary Examiner* — Hrayr A Sayadian
(74) *Attorney, Agent, or Firm* — Slater Matsil, LLP

(57) ABSTRACT

A method includes patterning a substrate to form a nanowire over the substrate, applying a plurality of doping processes to the nanowire to form a first drain/source region at a lower portion of the nanowire, a second drain/source region at an upper portion of the nanowire and a channel region, wherein the channel region is between the first drain/source region and the second drain/source region, depositing a first dielectric layer along sidewalls of the channel region, depositing a control gate layer over the first dielectric layer, wherein the control gate layer surrounds a lower portion of the channel region, depositing a second dielectric layer along the sidewalls of the channel region and over the control gate layer and forming a floating gate region surrounding an upper portion of the channel region.

20 Claims, 22 Drawing Sheets

(51) Int. Cl.
| | |
|---|---|
| *H01L 29/66* | (2006.01) |
| *H01L 29/775* | (2006.01) |
| *H01L 29/792* | (2006.01) |
| *H01L 27/11519* | (2017.01) |
| *H01L 27/11556* | (2017.01) |
| *H01L 27/11565* | (2017.01) |
| *H01L 27/11582* | (2017.01) |
| *H01L 21/28* | (2006.01) |
| *B82Y 10/00* | (2011.01) |
| *H01L 29/40* | (2006.01) |
| *H01L 29/423* | (2006.01) |
| *H01L 29/06* | (2006.01) |

(52) U.S. Cl.
CPC .. *H01L 21/28282* (2013.01); *H01L 27/11519* (2013.01); *H01L 27/11521* (2013.01); *H01L 27/11556* (2013.01); *H01L 27/11565* (2013.01); *H01L 27/11582* (2013.01); *H01L 29/0676* (2013.01); *H01L 29/401* (2013.01); *H01L 29/42324* (2013.01); *H01L 29/42376* (2013.01); *H01L 29/66439* (2013.01); *H01L 29/66666* (2013.01); *H01L 29/66825* (2013.01); *H01L 29/66833* (2013.01); *H01L 29/775* (2013.01); *H01L 29/7883* (2013.01); *H01L 29/7926* (2013.01)

(58) Field of Classification Search
CPC ......... H01L 27/11556; H01L 27/11565; H01L 27/11521; H01L 29/66666; H01L 27/11582; H01L 29/66838; H01L 21/28273; H01L 29/775; H01L 29/7926; H01L 29/0676; H01L 29/401; H01L 29/42324; H01L 29/66439; H01L 29/42376; B82Y 10/00
USPC .......................................... 257/316; 977/938
See application file for complete search history.

(56) References Cited

U.S. PATENT DOCUMENTS

| | | | |
|---|---|---|---|
| 2006/0231886 | A1 | 10/2006 | Forbes et al. |
| 2008/0149992 | A1 | 6/2008 | Gidon |
| 2008/0210985 | A1 | 9/2008 | Ogawa et al. |
| 2009/0121271 | A1 | 5/2009 | Son et al. |
| 2010/0181612 | A1 | 7/2010 | Kito et al. |
| 2010/0276667 | A1 | 11/2010 | Kim et al. |
| 2012/0213009 | A1 | 8/2012 | Aritome et al. |
| 2012/0256247 | A1 | 10/2012 | Alsmeier |
| 2013/0264544 | A1 | 10/2013 | Karg et al. |
| 2013/0307050 | A1 | 11/2013 | Ahn et al. |

FOREIGN PATENT DOCUMENTS

| | | |
|---|---|---|
| CN | 101675502 A | 3/2010 |
| CN | 103262243 A | 8/2013 |
| JP | 2009117843 A | 5/2009 |
| KR | 1998070269 | 10/1998 |
| KR | 20090007393 A | 1/2009 |
| KR | 20130127793 A | 11/2013 |
| WO | 2007136461 A2 | 11/2007 |

OTHER PUBLICATIONS

Bindal, A., et al., "The Design of Dual Work Function CMOS Transistors and Circuits Using Silicon Nanowire Technology," IEEE Transactions on Nanotechnology, vol. 6, No. 3, May 2007, pp. 291-302.

Bindal, A., et al., "Exploratory study on power-efficient silicon nano-wire dynamic NMOSFET/PMESFET logic," IET Science, Measurement & Technology, vol. 1, No. 2, pp. 121-130.

Choi, S., et al., "A Novel Junctionless All-Around-Gate SONOS Device with a Quantum Nanowire on a Bulk Substrate for 3D Stack NAND Flash Memory," VSLI Technology (VLSIT), Jun. 14-16, 2011, pp. 74-75.

Hamedi-Hagh, S., et al., "Spice Modeling of Silicon Nanowire Fied-Effect Transistors for High-Speed Analog Integrated Circuits," IEEE Transactions on Nanotechnology, vol. 7, No. 6, Nov. 2008, pp. 766-775.

Hamedi-Hagh, S., et al., "Design of Next Generation Amplifiers Using Nanowire FETs," Journal of Electrical Engineering & Technology, vol. 3, No. 4, pp. 566-570.

Lee, S. M., et al., "A comparative study on hot carrier effects in inversion-mode and junctionless MuGFETS," Solid-State Electronics 79, Jul. 5, 2012, pp. 253-257.

Mizutani, Y., et al., "A New Eprom Cell With a Side-Wall Floating Gate for High-Density and High-Performance Device," Electron Deivces Meeting, vol. 31, 1985, pp. 635-638.

Papadas, C., "A Novel Pseudo-Floating-Gate Flash EEPROM Device (Y-Cell)," IEEE Electron Device Letters, vol. 18, No. 7, Jul. 1997, pp. 319-322.

Park, C., "Investigation on Hot Carrier Effects in n-type Sort-Channel Junctionless Nanowire Transistors," 2012 12th IEEE International Conference on Nanotechnology (IEEE-NANO), The International Conference Centre Birmingham, Birmingham, United Kingdom, Aug. 20-23, 2012, pp. 1-4.

Sakui, K, et al., "A new vertical MOSFET "Vertical Logic Circuit (VLC) Mosfet" suppressing asymmetric characteristics and realizing an ultra compact and robust logic circuit," Semiconductor Device Research Symposium, ISDRS 2009, Dec. 9-11, 2009, 2 pages.

Sleight, J. W., et al., "Gate-All-Around Silicon Nanowire MOSFETs and Circuits," Device Research Conference (DRC), Jun. 21-23, 2010, pp. 269-272.

Sun, Y., et al., "Junctionless Vertical-Si-Nanowire-Channel-Based SONOS Memory With 2-Bit Storage per Cell," IEEE Electron Device Letters, vol. 32, No. 6, Jun. 2011, pp. 725-727.

Sun, Y., et al., "Junction-Less Stackable SONOS Memory Realized on Vertical-Si-Nanowire for 3-D Application," VLSI Technology, Systems and Applications (VLSI-TSA), 2011 International Symposium, Apr. 2011, 2 pages.

Sun, Y., et al., "Demonstration of Memory String with Stacked Junction-Less SONOS Realized on Vertical Silicon Nanowire," Electron Devices Meeting (IEDM), 2011 IEEE International, Dec. 5-7, 2011, pp. 9.7.1-9.7.4.

MEMORY DEVICE AND METHOD FOR FABRICATING THE SAME

PRIORITY CLAIM AND CROSS-REFERENCE

This is a divisional application of U.S. application Ser. No. 14/279,842, entitled "Memory Device and Method for Fabricating the Same", which was filed on May 16, 2014 and is incorporated herein by reference.

BACKGROUND

Modern electronic devices such as a notebook computer comprise a variety of memories to store information. Memory circuits include two major categories. One is volatile memories; the other is non-volatile memories. Volatile memories include random access memory (RAM), which can be further divided into two sub-categories, static random access memory (SRAM) and dynamic random access memory (DRAM). Both SRAM and DRAM are volatile because they will lose the information they store when they are not powered. On the other hand, non-volatile memories can keep data stored on them. Non-volatile memories include a variety of sub-categories, such as read-only-memory (ROM), electrically erasable programmable read-only memory (EEPROM) and flash memory.

Flash memory is a non-volatile device that can be electrically erased and reprogrammed. A typical flash memory comprises a memory array having a large number of flash memory cells arranged in rows, columns, and blocks. One of the most commonly known flash memories is the one-transistor flash memory. The memory cell of the one-transistor flash memory is fabricated as a field-effect transistor having two gates, namely a control gate and a floating gate. The floating gate is capable of holding charges and is separated from source and drain regions.

Each of the memory cells can be electrically charged by injecting hot electrons across an oxide layer (tunneling layer) onto the floating gate. The charges can be removed from the floating gate by tunneling the electrons to the substrate through the tunneling layer during an erase operation. Thus the data in a memory cell is determined by the presence or absence of charges in the floating gate.

As technologies evolve, vertical transistors are being researched recently. In a vertical transistor, a vertical nanowire formed over a substrate comprises a source, a channel and a drain of the vertical transistor. A gate dielectric and a gate electrode are formed to encircle the vertical nanowire. The encircled portion of the vertical nanowire forms the channel of a vertical transistor. The vertical transistor has a gate-all-around structure since the channel is surrounded by the gate electrode. Such a gate-all-around structure helps to minimize the short-channel effects of the vertical transistor.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION OF ILLUSTRATIVE EMBODIMENTS

Figure 1:
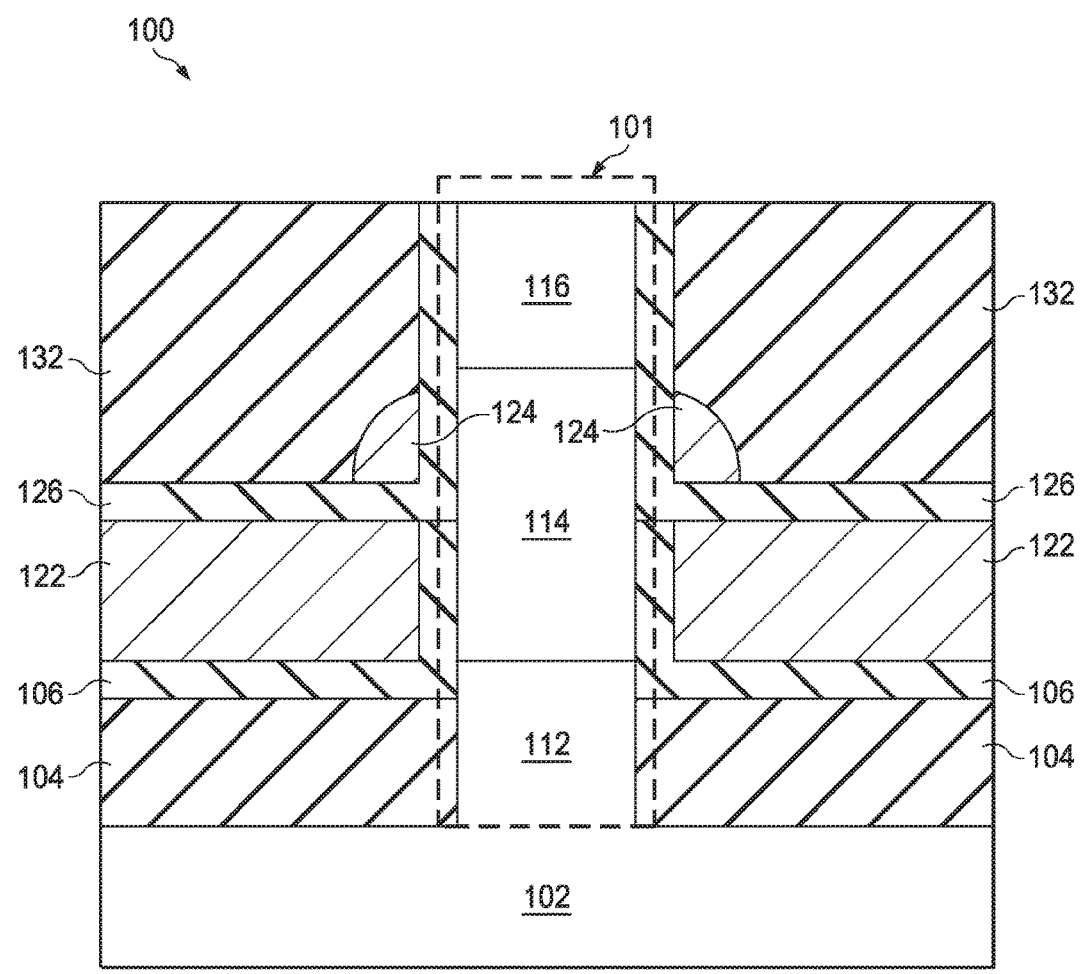
FIG. 1 illustrates a cross sectional view of a memory device in accordance with various embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 illustrates a cross sectional view of a memory device in accordance with various embodiments of the present disclosure. In some embodiments, the memory device 100 is a flash memory device. The flash memory device 100 comprises a transistor having two gates, namely a control gate 122 and a floating gate 124. The transistor is fabricated as a nanowire 101. As shown in FIG. 1, the nanowire 101 is formed over a substrate 102.

The nanowire 101 may comprise a first drain/source region 112, a channel region 114 formed over the first drain/source region 112 and a second drain/source region 116 formed over the channel region 114. An upper portion of the channel region 114 is alternatively referred to as a drift region or a gate-drain underlap region. Such an upper portion as shown in FIG. 1 is the channel region above the top surface of the control gate 122. In accordance with some embodiments, the first drain/source region 112 is a source region. The second drain/source region 116 is a drain region. Throughout the description, the first drain/source region 112 may be alternatively referred to as the source region 112. Likewise, the second drain/source region 116 may be alternatively referred to as the drain region 116.

The memory device 100 further comprises a gate dielectric layer 106 and the control gate 122. As shown in FIG. 1, a lower portion of the channel region 114 is surrounded by a vertical portion of the gate dielectric layer 106 and the control gate 122. The control gate 122 and the lower portion of the channel region 114 are separated by the vertical portion of the gate dielectric layer 106 as shown in FIG. 1.

The memory device 100 further comprises a tunneling layer 126 and the floating gate 124. As shown in FIG. 1, the tunneling layer 126 is formed over the control gate 122. More particularly, a horizontal portion of the tunneling layer 126 is formed on the top surface of the control gate 122. A vertical portion of the tunneling layer 126 is formed along the sidewall of the nanowire 101. As shown in FIG. 1, the upper portion of the channel region 114 is surrounded by the vertical portion of the tunneling layer 126.

The floating gate 124 is formed along the sidewall of the channel region 114. More particularly, the floating gate 124 and the upper portion of the channel region 114 are separated by the vertical portion of the tunneling layer 126. The floating gate 124 is a ring-shaped structure. As shown in FIG. 1, the upper portion of the channel region 114 is surrounded by the floating gate 124.

The memory device 100 may further comprise a first inter-layer dielectric layer 104 and a second inter-layer dielectric layer 132. As shown in FIG. 1, the first inter-layer dielectric layer 104 is formed between the substrate 102 and the control gate 122. The second inter-layer dielectric layer 132 is formed over the control gate 122. As shown in FIG. 1, the nanowire 101 is embedded in the second inter-layer dielectric layer 132. The top surface of the second inter-layer dielectric layer 132 is level with the top surface of the second drain/source region 116. In alternative embodiments, the nanowire 101 is partially embedded in the second inter-layer dielectric layer 132. The detailed fabrication process of the memory device 100 will be described below with respect to FIGS. 10-19.

One advantageous feature of having the memory device shown in FIG. 1 is the memory device 100 can be fabricated in a process compatible with the fabrication process of logic transistors. The control gate 122 shown in FIG. 1 is the same as the gate of logic transistors. The gate dielectric layer 106 is the same as the gate dielectric layer of logic transistors. In other words, the memory device 100 has the same gate stack as logic transistors. The floating gate 124 shown in FIG. 1 may be added through a simple spacer process that does not require additional lithography processes.

Figure 2:
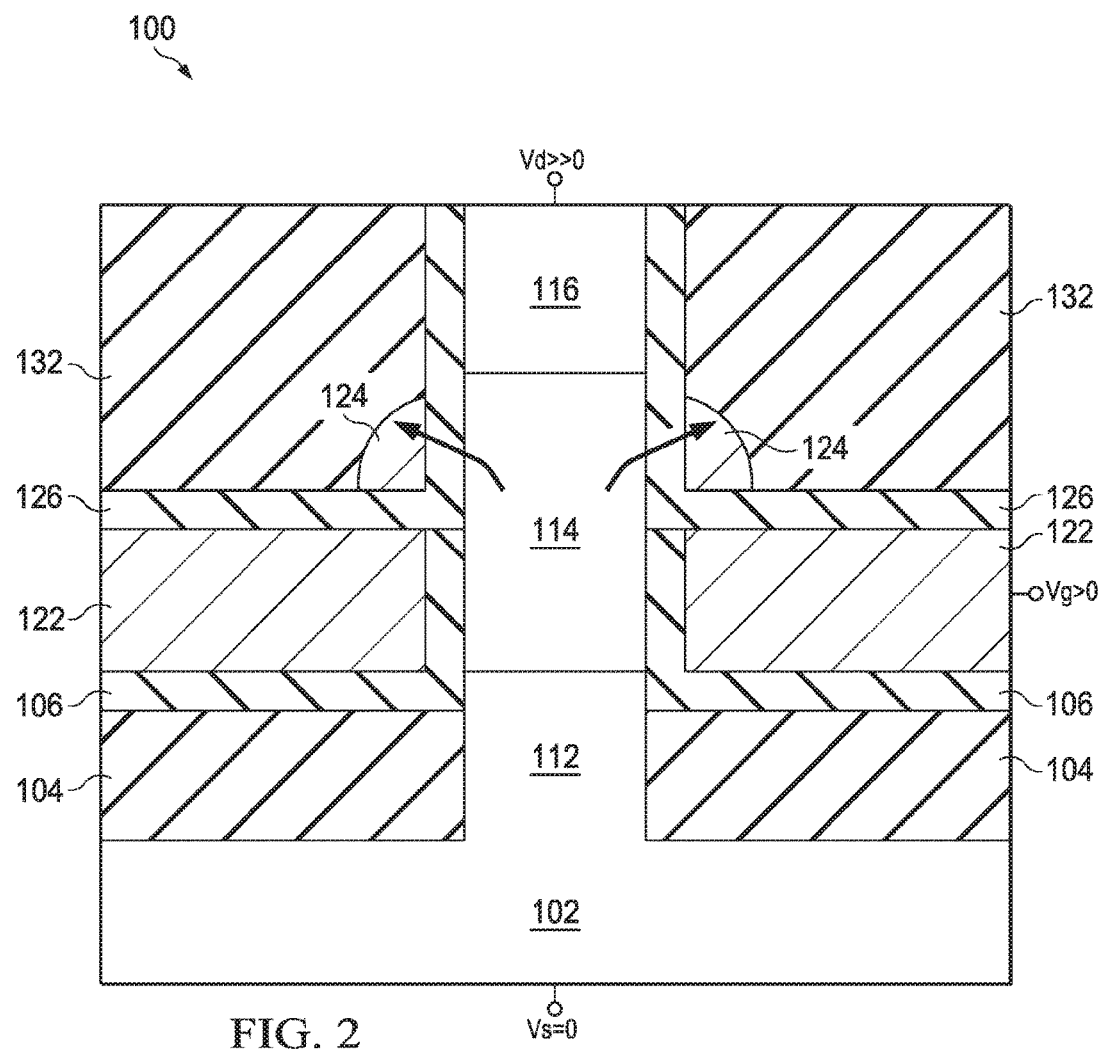
FIG. 2 illustrates a programming mechanism of the memory device shown in FIG. 1 in accordance with various embodiments of the present disclosure.
Figure 3:
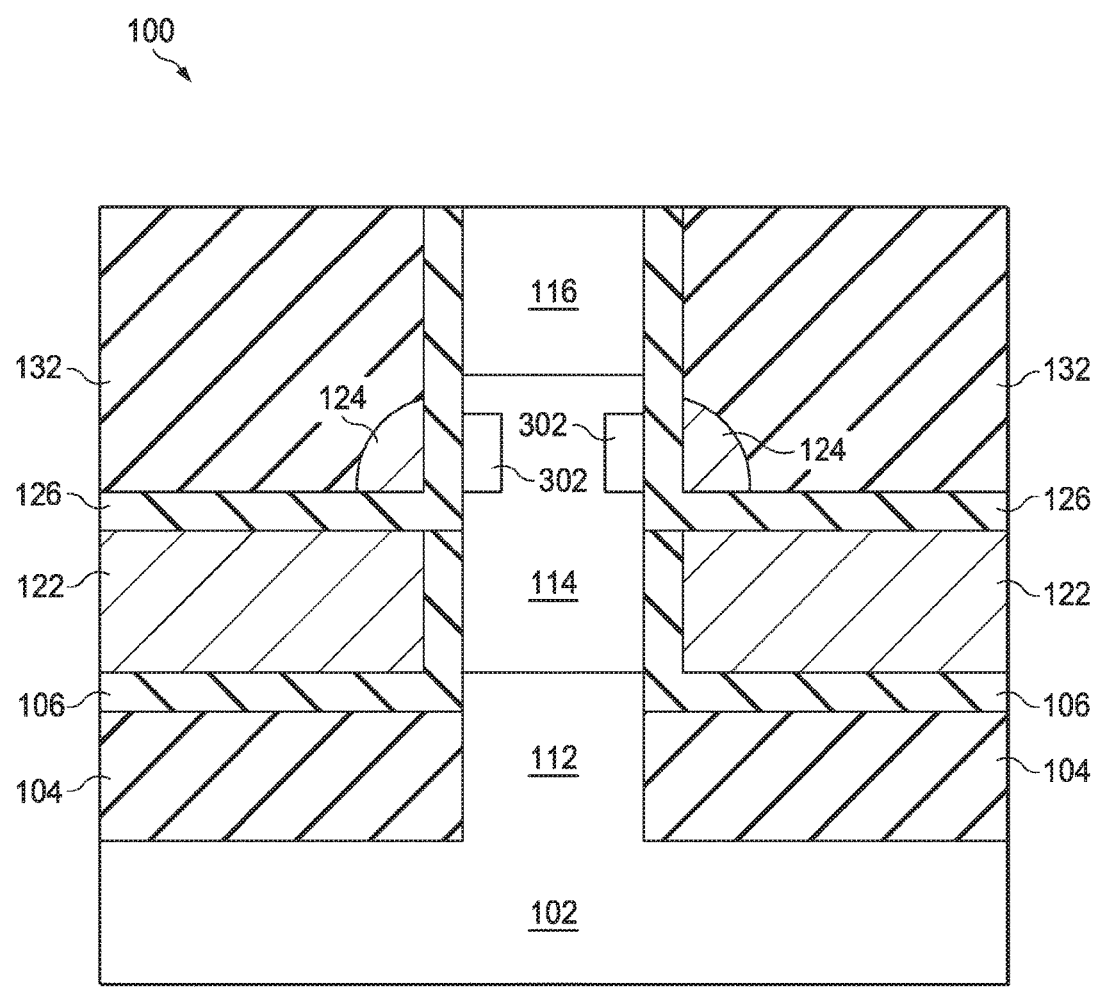
FIG. 3 illustrates a cross sectional view of the memory device shown in FIG. 1 after electrons have been injected into the floating gate in accordance with various embodiments of the present disclosure.

FIGS. 2-3 illustrate programming mechanisms of the memory device 100 shown in FIG. 1. The memory device 100 is a flash memory device including the floating gate 124. The floating gate 124 is commonly known as a storage layer. According to the operation principles of a flash memory device, the floating gate layer is employed to store gate charge so that the logic of the memory device 100 can be retained even if electrical power is terminated. The detailed programming mechanisms of the memory device 100 will be described below in detail with respect to FIGS. 2-3.

FIG. 2 illustrates a programming mechanism of the memory device shown in FIG. 1 in accordance with various embodiments of the present disclosure. The logic of the memory device 100 may be programmed by injecting hot-electrons into the floating gate 124. To perform this injection, a positive gate voltage $V_G$ is applied to the control gate 122 to turn on the transistor. In addition, a large bias voltage $V_D$ is applied to the drain region 116. Such a large bias voltage helps to accelerate electrons enough to generate hot electrons (not shown). The hot-electrons are generated in a drift region (e.g., the upper portion of the channel region 114 situated above the control gate 122 that can also be referred to as a gate-drain underlap region). More particularly, the drift region is located between the edge of the drain region 116 and the edge of the floating gate 124. As indicated by the arrows shown in FIG. 2, the hot-electrons are injected into the floating gate 124 through the tunneling layer 126. As a result, the logic of the memory device 100 is programmed into the floating gate 124.

One advantageous feature of the hot electron generation mechanism described above is that the generation of the hot electrons takes place outside the channel region. In fact, the generation of the hot electrons takes place in a region between the edge of the floating gate and the drain. Such a hot electron generation mechanism helps to reduce the degradation of the gate dielectric of the memory device 100 when the memory device 100 goes through a plurality of program/erase cycles.

FIG. 3 illustrates a cross sectional view of the memory device shown in FIG. 1 after hot electrons have been injected into the floating gate in accordance with various embodiments of the present disclosure. Once the floating gate 124 has received a negative charge of electrons, the negative charge will generate one depletion region 302 and reduce the electron concentration in the drift region. The reduced electron concentration increases the total resistance of the transistor. As a consequence, the current in the transistor is reduced. It should be noted while FIG. 3 illustrates two depletion regions from a cross sectional view, the region 302 is a ring-shaped depletion region from a top view.

Figure 4:
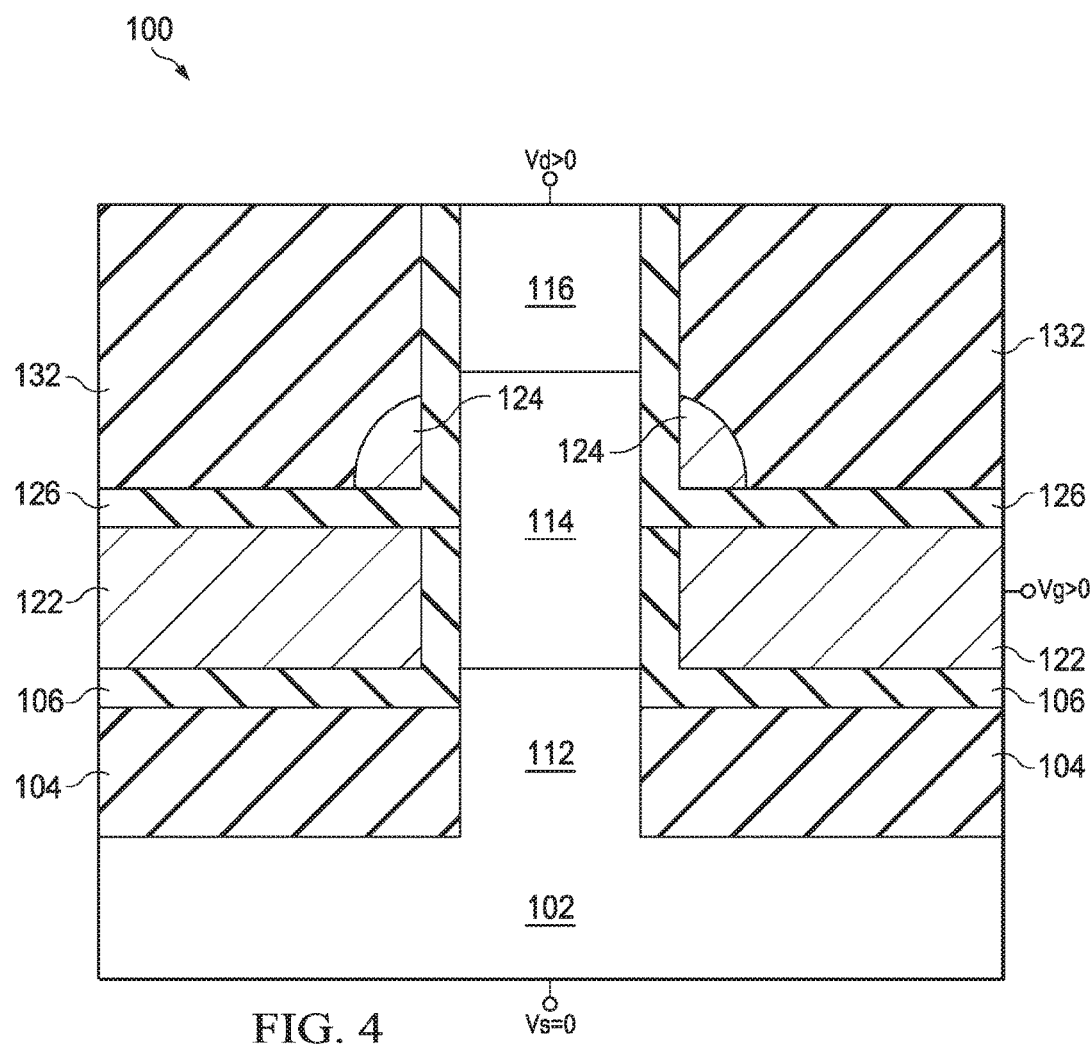
FIG. 4 illustrates a read mechanism of the memory device shown in FIG. 1 in accordance with various embodiments of the present disclosure.

FIG. 4 illustrates a read mechanism of the memory device shown in FIG. 1 in accordance with various embodiments of the present disclosure. The READ operation of the memory device 100 can be performed by using a positive $V_G$ (e.g., $V_G>0$ as shown in FIG. 4) and a small positive $V_D$ (e.g., $V_D>0$ as shown in FIG. 4). It should be noted that under the read mechanism shown in FIG. 4, the source region of the memory device 100 is connected to ground as shown in FIG. 4. It should further be noted that the $V_D$ shown in FIG. 4 is smaller than the $V_D$ shown in FIG. 2.

Alternatively, the READ operation of the memory device 100 can be performed by reversing the drain and source's voltage connections (not shown). More particularly, the drain region is connected to ground and the source region of the memory device 100 is connected to a small positive voltage.

Figure 5:
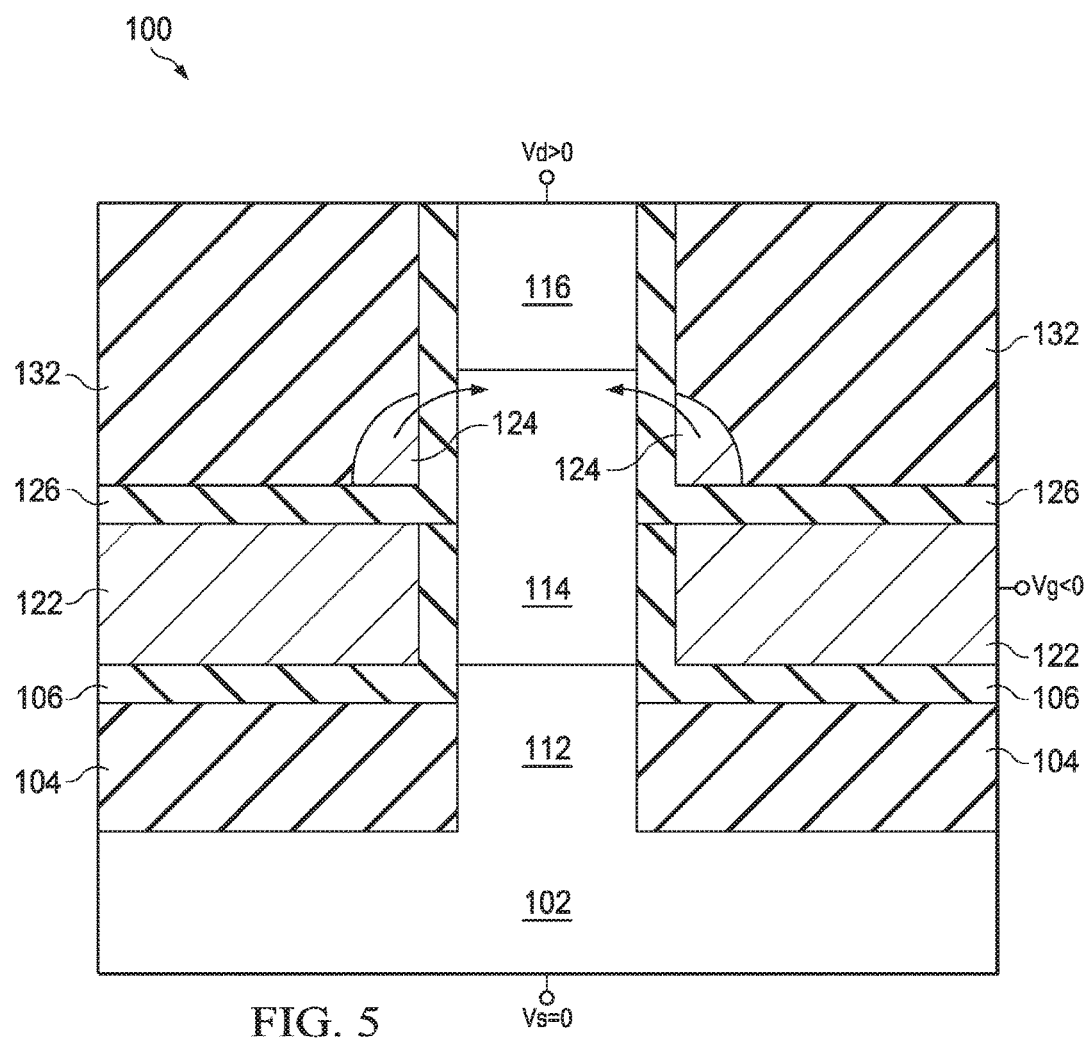
FIG. 5 illustrates an erase mechanism of the memory device shown in FIG. 1 in accordance with various embodiments of the present disclosure.

FIG. 5 illustrates an erase mechanism of the memory device shown in FIG. 1 in accordance with various embodiments of the present disclosure. The electrons of the floating gate 124 can be removed by tunneling the electrons to the channel region 114 through the tunneling layer 126 during an erase operation. More particularly, as shown in FIG. 5, a positive voltage may be applied to the drain region 116 and a negative voltage is applied to the control gate 122. The source region is connected to ground. Such a configuration of the drain and gate voltages may force the electrons to tunnel back into the nanowire 101 as indicated by the arrows, thereby removing the charge stored in the floating gate 124.

Figure 6:
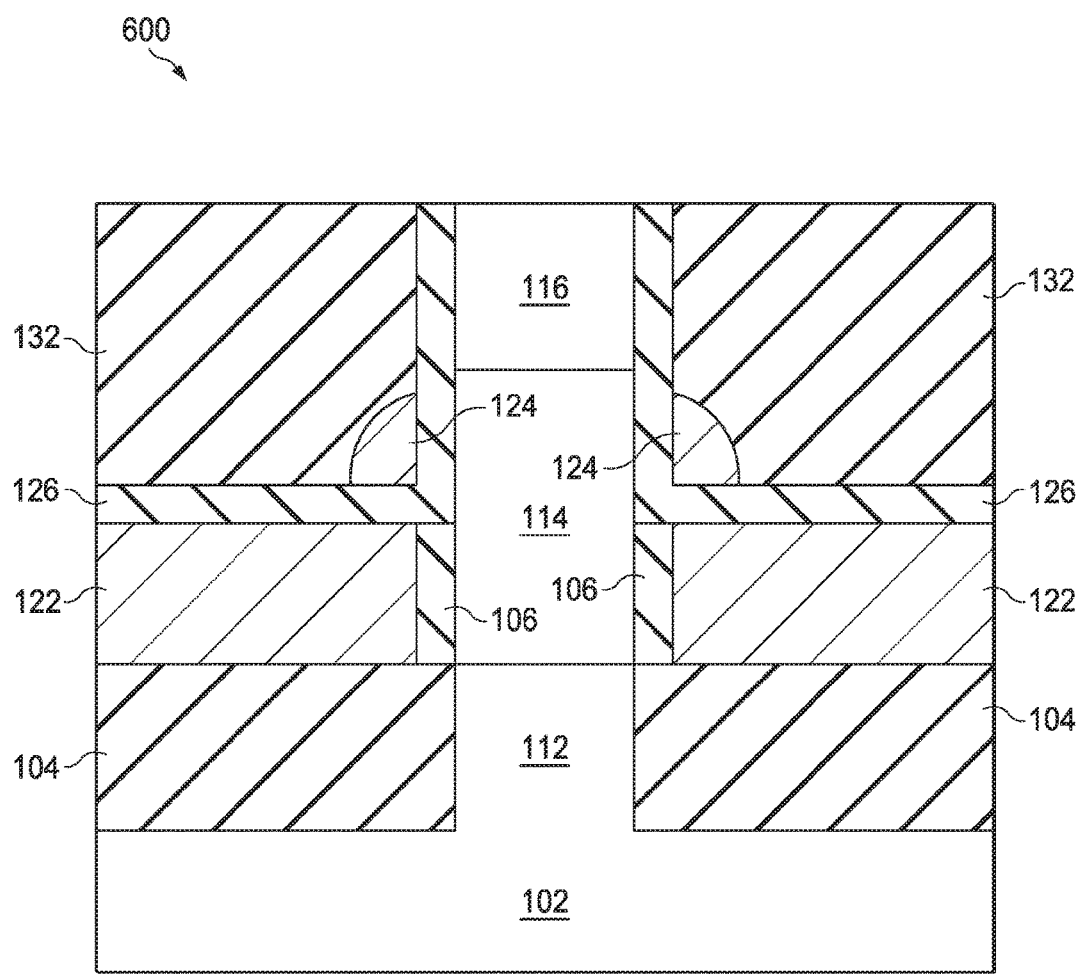
FIG. 6 illustrates a cross sectional view of another memory device in accordance with various embodiments of the present disclosure.

FIG. 6 illustrates a cross sectional view of another memory device in accordance with various embodiments of the present disclosure. The memory device 600 is similar to the memory device 100 shown in FIG. 1 except that the inter-layer dielectric layer 104 is in direct contact with the control gate 122. The fabrication process of the memory device 600 is similar to that of the memory device 100 shown in FIG. 1, and hence is not discussed again to avoid unnecessary repetition.

Figure 7:
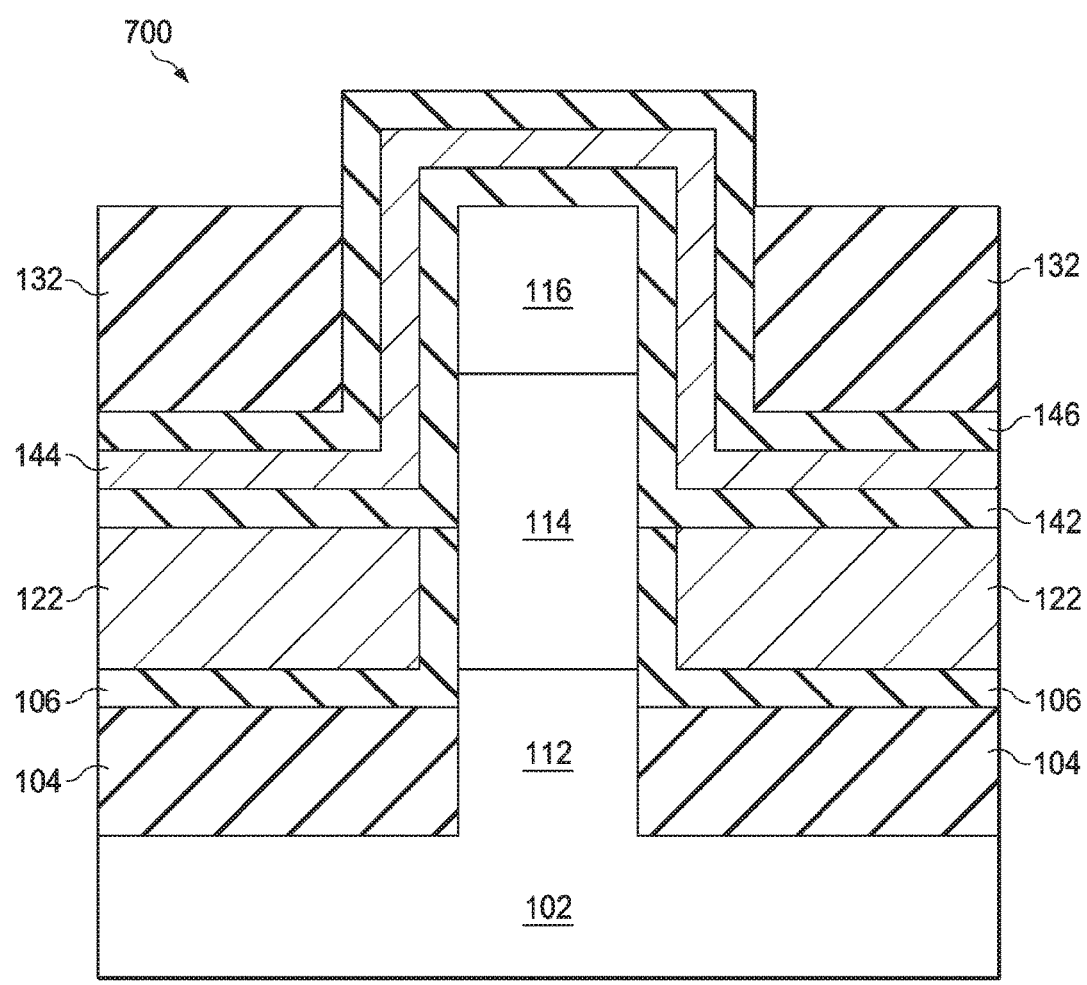
FIG. 7 illustrates a cross sectional view of yet another memory device in accordance with various embodiments of the present disclosure.

FIG. 7 illustrates a cross sectional view of yet another memory device in accordance with various embodiments of the present disclosure. The memory device 700 is similar to the memory device 100 shown in FIG. 1 except that the floating gate of the memory device 700 is formed by an O—N—O structure. As shown in FIG. 7, the O—N—O structure may comprise a first oxide layer 142, a nitride layer 144 formed over the first oxide layer 142 and a second oxide layer 146 formed over the nitride layer 144. The nitride layer 144 may function as a storage region for the memory device 700. The detailed fabrication process of the memory device 700 will be described below with respect to FIGS. 21-24.

Figure 8:
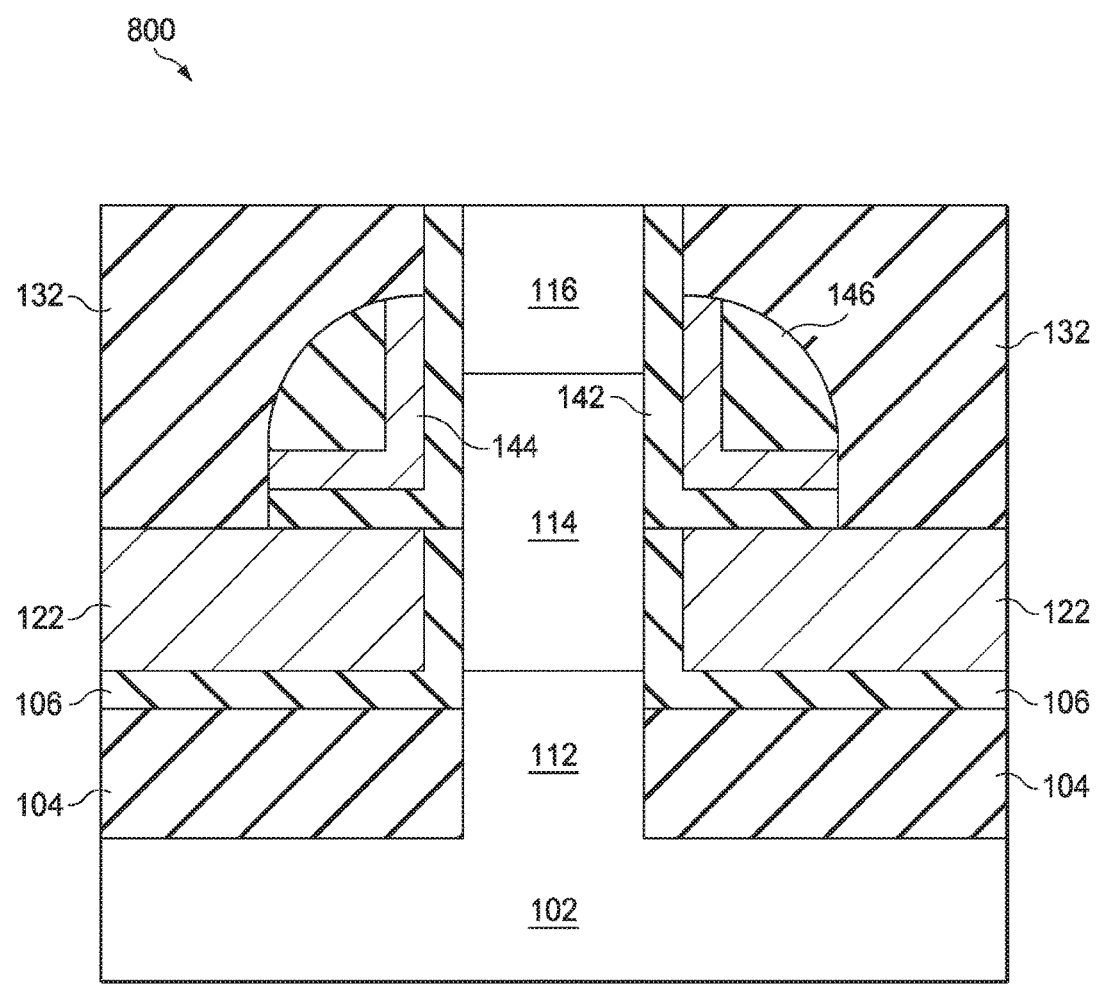
FIG. 8 illustrates a cross sectional view of yet another memory device in accordance with various embodiments of the present disclosure.

FIG. 8 illustrates a cross sectional view of yet another memory device in accordance with various embodiments of the present disclosure. The memory device 800 is similar to the memory device 700 shown in FIG. 7 except that the floating gate is of a ring shape after a patterning process is applied to the O—N—O structure shown in FIG. 7. The remaining nitride layer 144 shown in FIG. 8 may function as a storage region for the memory device 800. The detailed fabrication process of the memory device 800 will be described below with respect to FIGS. 26-28.

Figure 9:
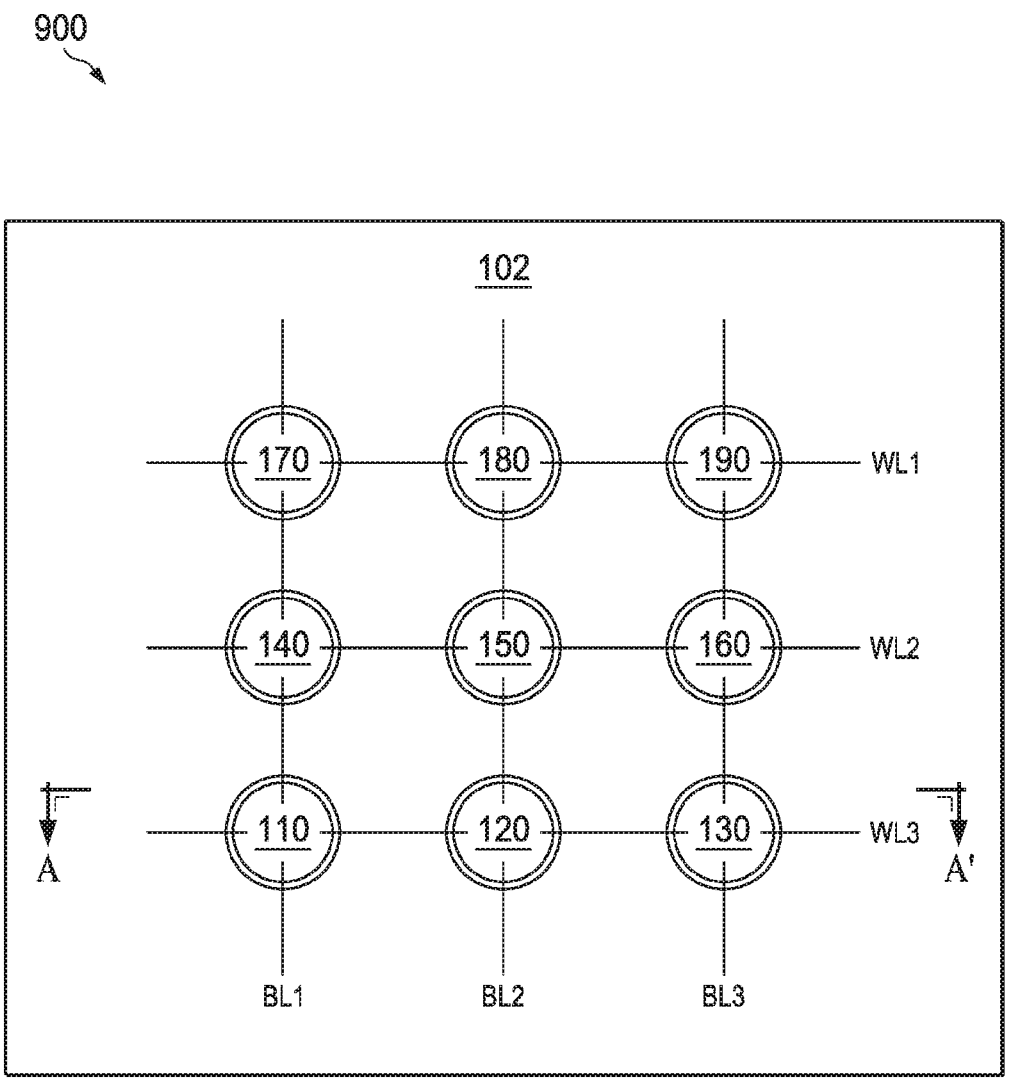
FIG. 9 illustrates a top view of a semiconductor device in accordance with various aspects of the present disclosure.

FIG. 9 illustrates a top view of a semiconductor device in accordance with various aspects of the present disclosure. The semiconductor device 900 comprises twelve nanowires formed over the substrate 102. These twelve nanowires are arranged in rows and columns as shown in FIG. 9. A first row may include nanowires 110, 120 and 130. A second row may include nanowires 140, 150 and 160. A third row may include nanowires 170, 180 and 190. Each nanowire (e.g., nanowire 110) shown in FIG. 9 may be of a same structure as the nanowire 101 shown in FIG. 1.

In some embodiments, each nanowire (e.g., nanowire 110) is a flash memory cell comprising a source region, a drain region and a control gate. The flash memory cells shown in FIG. 9 form a flash memory system. In some embodiments, the source regions of the twelve nanowires are connected to ground. The control gates in a same row are connected together to form a word line (e.g., WL1, WL2 and WL3) of the flash memory system. The drain regions in a same column are connected together to form a bit line (e.g., BL1, BL2 and BL3) of the flash memory system. A flash memory cell may be selected by selecting appropriate word and bit lines. For example, the flash memory cell formed by the nanowire 150 may be selected by choosing the second bit line BL2 and the second word line WL2.

It should be noted while FIG. 9 illustrates each nanowire is a flash memory transistor, the nine nanowires shown in FIG. 9 may be tied together to form a single flash memory transistor.

It should be recognized that while FIG. 9 illustrates the semiconductor device 900 with twelve nanowires, the semiconductor device 900 could accommodate any number of nanowires. It should further be noted that the nanowires (e.g., nanowire 110) are substantially circular in shape. It is within the scope of various embodiments of the present disclosure for the nanowires to comprise other shapes, such as, but no limited to oval, square, rectangular and/or the like.

Figure 10:
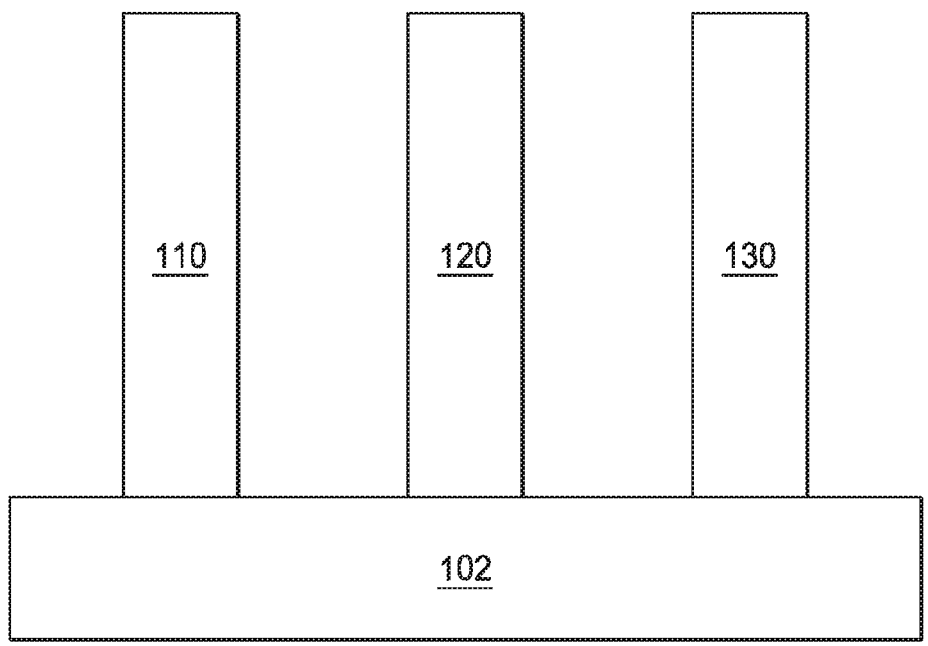
FIGS. 10-19 illustrate intermediate steps of fabricating the flash memory device shown in FIG. 1 in accordance with various embodiments of the present disclosure.

FIGS. 10-19 illustrate intermediate steps of fabricating the flash memory device shown in FIG. 1 in accordance with various embodiments of the present disclosure. FIG. 10 illustrates a plurality of nanowires formed over a substrate in accordance with various embodiments of the present disclosure. The cross sectional view shown in FIG. 10 is taken along line A-A' shown in FIG. 9. As shown in FIG. 10, there may be three nanowires 110, 120 and 130 formed over the substrate 102.

The substrate 102 may be formed of silicon, although it may also be formed of other group III, group IV, and/or group V elements, such as silicon, germanium, silicon germanium, gallium arsenide, any combinations thereof and/or the like. The substrate 102 may comprise bulk silicon, doped or undoped, or an active layer of a silicon-on-insulator (SOI) substrate. Other suitable substrates that may be used include multi-layered substrates, gradient substrates, or hybrid orientation substrates.

The nanowires 110, 120 and 130 may be formed by using suitable semiconductor fabrication processer. For example, the nanowires 110, 120 and 130 may be formed by patterning the substrate 102 and etching away an upper portion of the substrate 102. Alternatively, the nanowires 110, 120 and 130 may be formed by applying a multiple lithography process to the substrate 102.

Furthermore, the nanowires 110, 120 and 130 may be formed by forming openings in a mask layer over the substrate 102, performing an epitaxy to grow a semiconductor layer (such as silicon, silicon germanium, III-V semiconductor, or the like) in the openings and removing the mask layer to form the nanowires 110, 120 and 130.

It should be noted that while FIG. 10 illustrates three nanowires are formed over the substrate 102, the substrate 102 could accommodate any number of nanowires. Three nanowires (e.g., nanowires 110, 120 and 130) are illustrated for simplicity.

Figure 11:
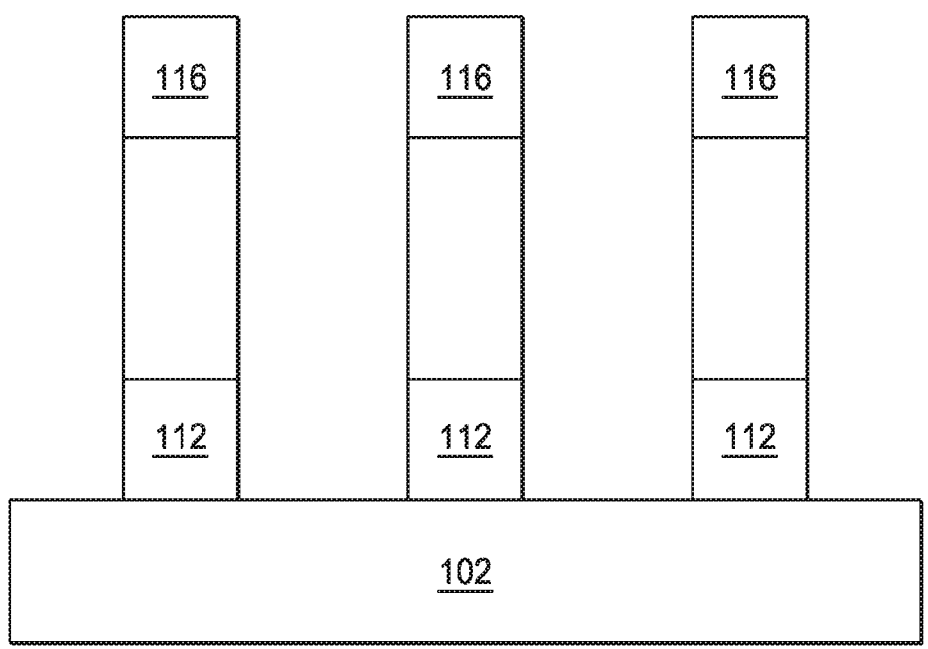

FIG. 11 illustrates a cross sectional view of the semiconductor device shown in FIG. 10 after a doping process is applied to the semiconductor device in accordance with various embodiments of the present disclosure. The first drain/source region 112 and the second drain/source region 116 are formed through an implantation process. The implantation process is well known, and hence is not discussed herein to avoid repetition. In alternative embodiments, the doping process can be achieved during an epitaxial growth process before or after the formation of the nanowires. Furthermore, the doping process can be achieved by other various techniques as well, such as plasma-immersion doping and/or the like.

In some embodiments, the first drain/source region 112 comprises a p-type material, p+ type material, p++ type material after p-type dopants are implanted into the first drain/source region 112. The p-type dopants include boron, gallium, indium, or the like. In alternative embodiments, the first drain/source region 112 comprises an n-type material, n+ type material, n++ type material and/or the like after p-type dopants are implanted into the first drain/source region 112. The n-type dopants include phosphorous, arsenic and/or the like. In some embodiments, the first drain/source region 112 is a source region.

Likewise, the second drain/source region 116 comprises a p-type material, p+ type material, p++ type material after p-type dopants are implanted into the second drain/source region 116. The p-type dopants include boron, gallium, indium, or the like. In alternative embodiments, the second drain/source region 116 comprises an n-type material, n+ type material, n++ type material and/or the like after n-type dopants are implanted into the second drain/source region 116. The n-type dopants include phosphorous, arsenic and/or the like. In some embodiments, the second drain/source region 116 is a drain region. In alternative embodiments, the doping process can be achieved during an epitaxial growth process before or after the formation of the nanowires. Furthermore, the doping process can be achieved by other various techniques as well, such as plasma-immersion doping and/or the like.

It should be noted that the implantation process described above is merely an example, which should not unduly limit the scope of the claims. One of ordinary skill in the art would recognize many variations, alternatives, and modifications. For example, the first drain/source region 112 and the second drain/source region 116 may be formed by other suitable doping techniques such as a diffusion process.

Alternatively, the first drain/source region 112 and the second drain/source region 116 may be formed by an epitaxial growth process. For example, a first N++ layer may be formed through a first epitaxial growth process. The first N++ layer may function as a source region. A lightly doped layer (e.g., an N layer or P layer) may be formed over the first N++ layer through a second epitaxial growth process. The lightly doped layer may function as a channel region. Then, a second N++ layer may be formed over the lightly doped layer through a third epitaxial growth process. The second N++ layer may function as a drain region. After the epitaxial processes described above, an etching process may be employed to form the nanowires shown in FIG. 11.

Figure 12:
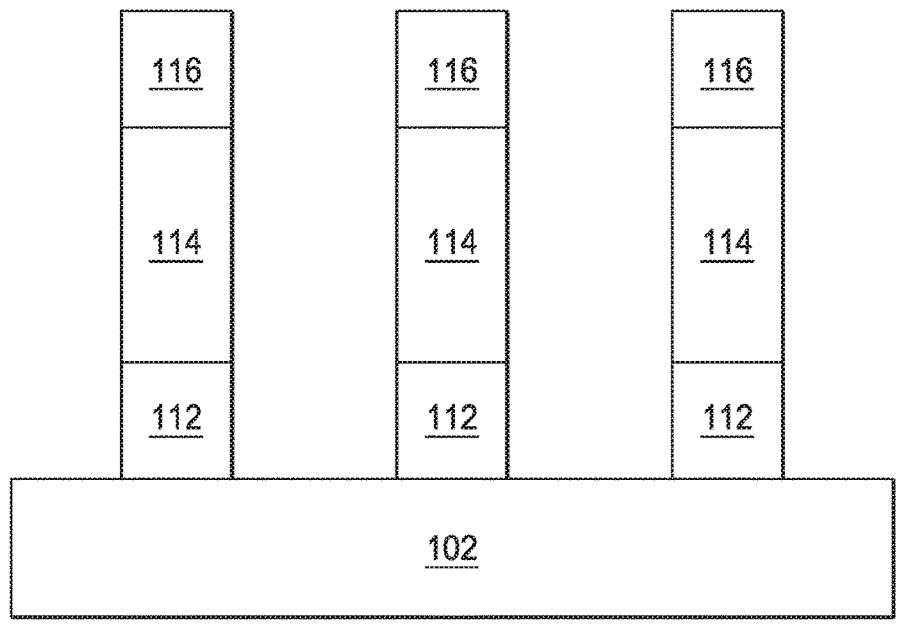

FIG. 12 illustrates a cross sectional view of the semiconductor device shown in FIG. 9 after a doping process is applied to the semiconductor device in accordance with various embodiments of the present disclosure. In some embodiments, the channel region 114 is formed by a tilted or angled doping process, in which dopants are implanted into the nanowires at a non-vertical angle relative to the substrate 102. The tilted implantation process is well known, and hence is not discussed herein to avoid repetition. In alternative embodiments, the doping process can be achieved during an epitaxial growth process before or after the formation of the nanowires. Furthermore, the doping process can be achieved by other various techniques as well, such as plasma-immersion doping and/or the like.

In some embodiments, the channel region 114 comprises a p-type material, p+ type material, p++ type material after p-type dopants are implanted into the channel region 114. The p-type dopants include boron, gallium, indium, or the like. In alternative embodiments, the channel region 114 comprises an n-type material, n+ type material, n++ type material and/or the like after p-type dopants are implanted into the channel region 114. The n-type dopants include phosphorous, arsenic and/or the like.

In some embodiments, the material of the channel region 114 may be different from the materials of the first drain/source region 112 and the second drain/source region 116. For example, in an N-channel device, the channel region 114 comprises an n+ type material. Both the first drain/source region 112 and the second drain/source region 116 comprise an n++ type material.

It should be noted that the tilted implantation process described above is merely an example, which should not unduly limit the scope of the claims. One of ordinary skill in the art would recognize many variations, alternatives, and modifications. For example, the channel region 114 may be formed by other suitable implantation techniques. Furthermore, in some embodiments, the channel region 114 may be left undoped depending on different design needs and applications.

Figure 13:
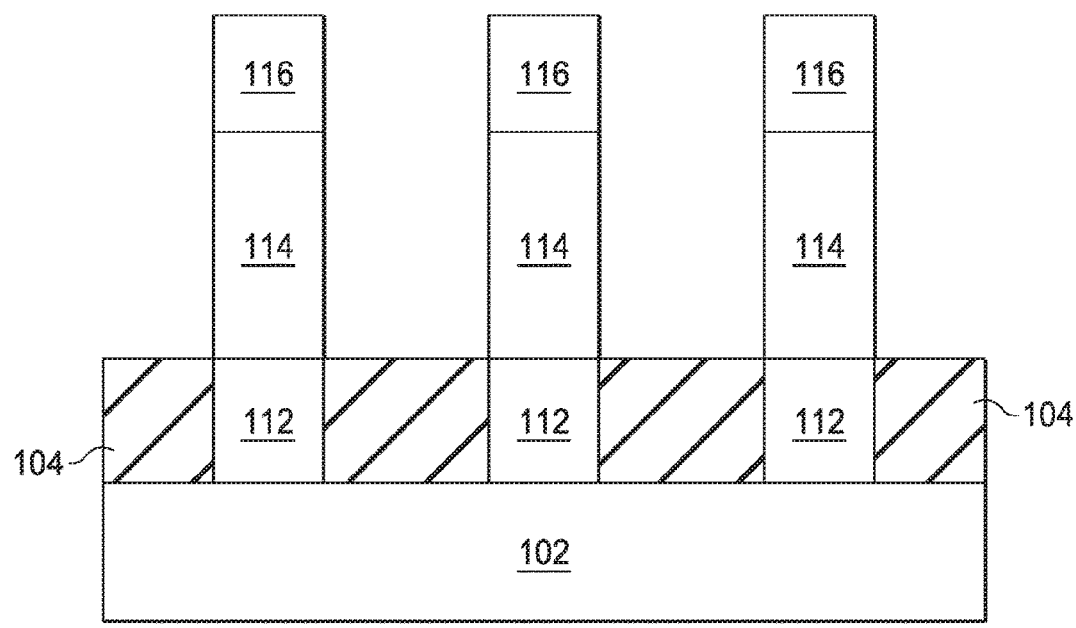

FIG. 13 illustrates a cross sectional view of the semiconductor device shown in FIG. 12 after an inter-layer dielectric layer is formed over the semiconductor device in accordance with various embodiments of the present disclosure. The inter-layer dielectric layer 104 may comprise doped or undoped silicon oxide, although other materials such as silicon nitride doped silicate glass, high-k materials, combinations of these, and/or the like, may alternatively be utilized. The inter-layer dielectric layer 104 may be formed by suitable fabrication techniques such as chemical vapor deposition (CVD), sputtering, or any other methods.

Figure 14:
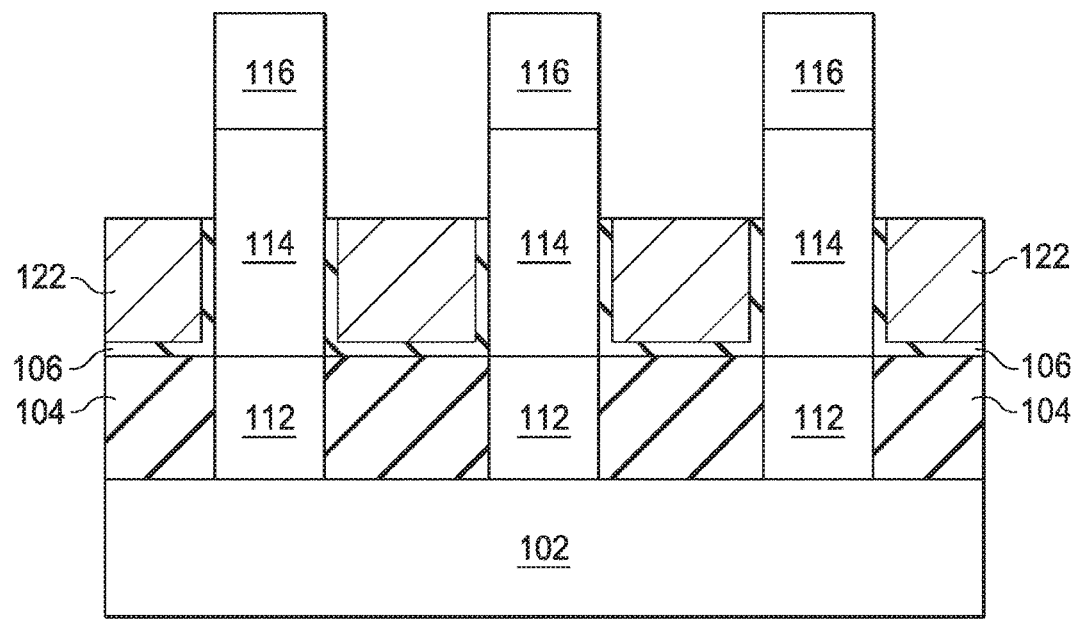

FIG. 14 illustrates a cross sectional view of the semiconductor device shown in FIG. 13 after a high-k dielectric layer and a control gate layer are formed over the semiconductor device in accordance with various embodiments of the present disclosure. The high-k dielectric layer 106 is formed along the sidewalls of the channel regions 114 and over the top surface of the inter-layer dielectric layer 104. The high-k dielectric layer 106 may be formed of suitable high-k materials such as dielectric materials having a relative permittivity value greater than about 4. The high-k dielectric layer 106 may be formed using any suitable fabrication processes such as CVD, plasma enhanced chemical vapor deposition (PECVD) and/or the like.

The control gate layer 122 is formed over the high-k dielectric layer 106. The control gate layer 122 may be formed of conductive materials such as polysilicon doped with n-type impurities, polysilicon doped with p-type impurities, metals, metal silicides, metal nitrides, and combinations thereof.

In some embodiments, the control gate layer 122 is formed of poly-silicon, the control gate layer 122 may be formed by depositing doped or undoped poly-silicon by low-pressure chemical vapor deposition (LPCVD).

Figure 15:
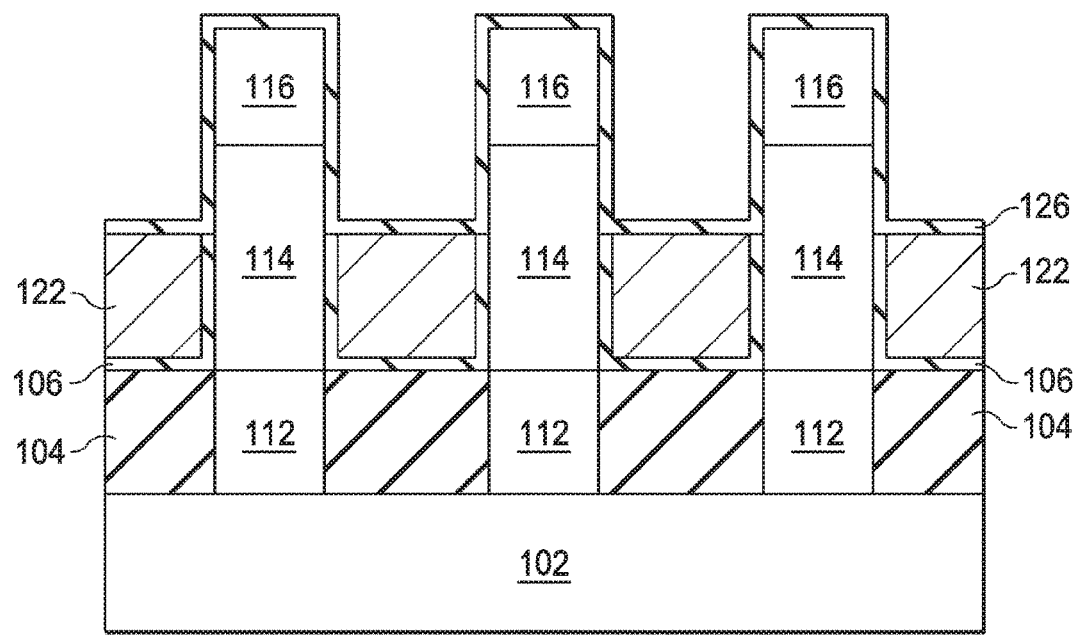

FIG. 15 illustrates a cross sectional view of the semiconductor device shown in FIG. 14 after a tunneling layer is formed over the semiconductor device in accordance with various embodiments of the present disclosure. In some embodiments, the tunneling layer 126 may comprise oxide materials such as a metal oxide. The silicon oxide layer may be implemented using a suitable process such as furnace, rapid thermal oxide (RTO), CVD, atomic layer deposition (ALD), LPCVD, PECVD, high-density plasma chemical vapor deposition (HDPCVD), combinations of these or the like In alternative embodiments, the tunneling layer 126 may comprise a high-k dielectric material such as $AlLaO_3$, $HfAlO_3$, $HfO_2$, $Ta_2O_5$, $Al_2O_3$, $ZrO_2$, $TiO_2$, $SrTiO_3$ and any combinations thereof and/or the like.

Figure 16:
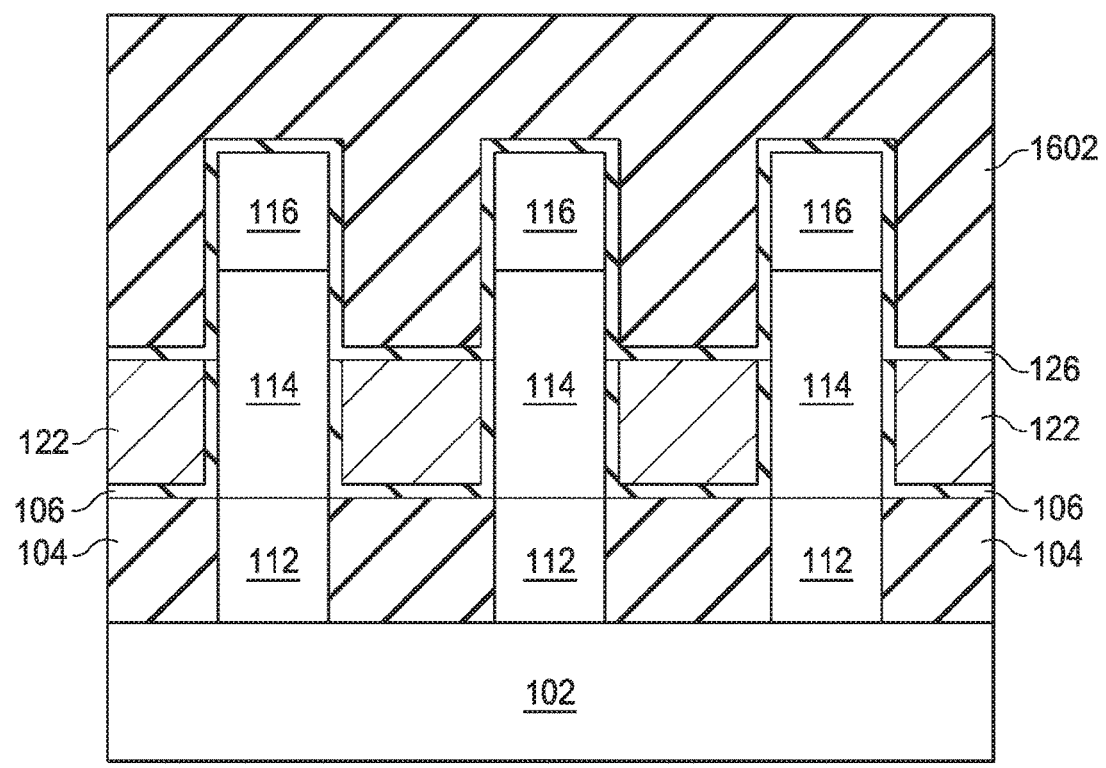

FIG. 16 illustrates a cross sectional view of the semiconductor device shown in FIG. 15 after a floating gate layer is formed over the semiconductor device in accordance with various embodiments of the present disclosure. In some embodiments, the floating gate layer 1602 may be formed of heavily doped polysilicon, amorphous silicon, metal and/or the like. In alternative embodiments, the floating layer 1602 may be formed of silicon nitride. Furthermore, the floating gate layer 1602 may comprises other suitable conductive materials such as metal silicides, metal nitrides and/or the like.

Figure 17:
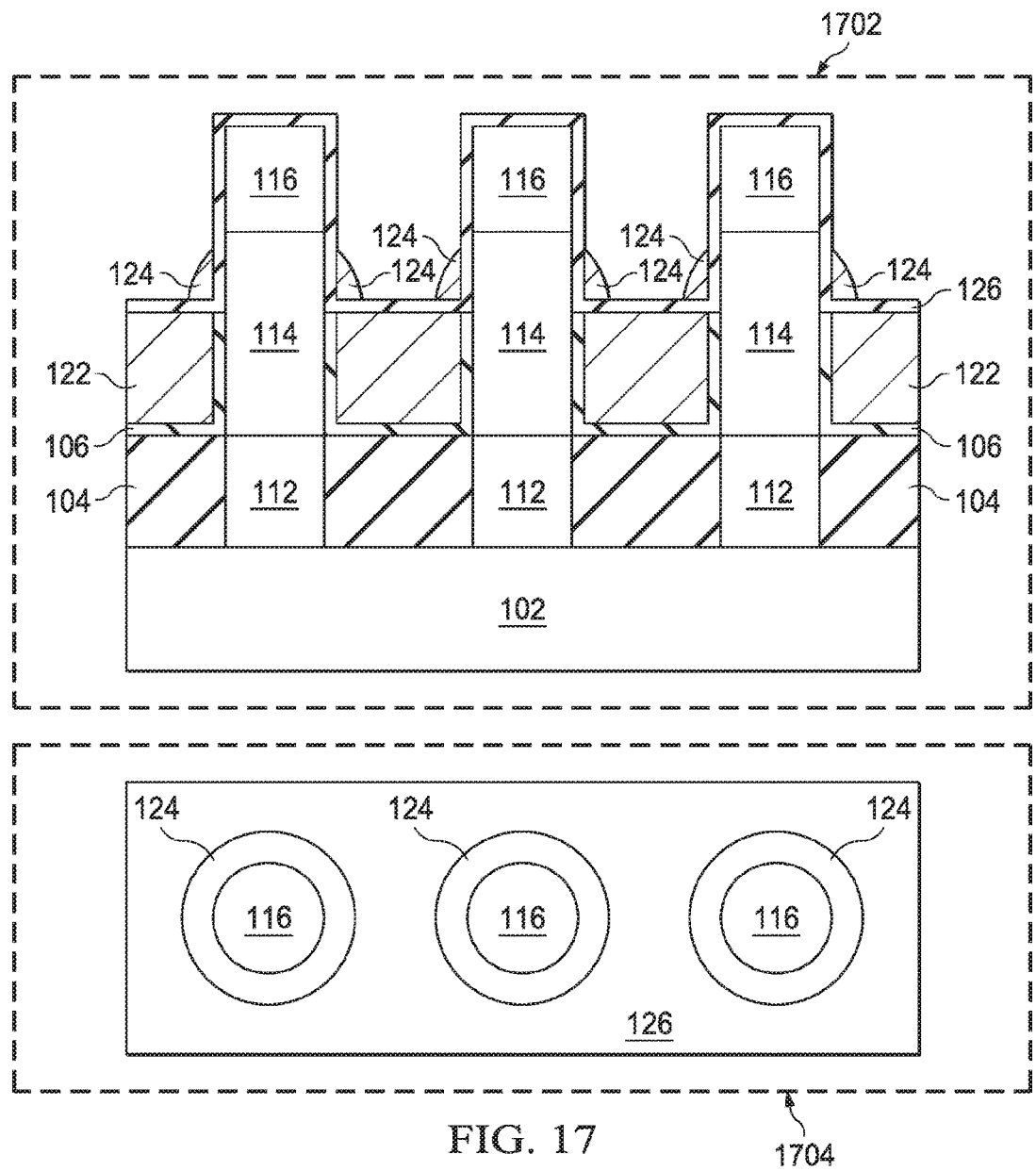

FIG. 17 illustrates the semiconductor device shown in FIG. 16 after an etching process is applied to the floating gate layer in accordance with various embodiments of the present disclosure. An etching process is applied to the floating gate layer 1602. By controlling the strength and direction of the etching process, portions of the floating gate layer 1602 have been removed as shown in a cross sectional view 1702 of the semiconductor device.

As shown in FIG. 17, after the etching process finishes, there may be three resulting floating gates 124. As shown in FIG. 17, the floating gates 124 are formed along sidewalls of the upper portions of the channel regions 114. The floating gates 124 are of a ring shape as shown in a top view 1704 of the semiconductor device.

Figure 18:
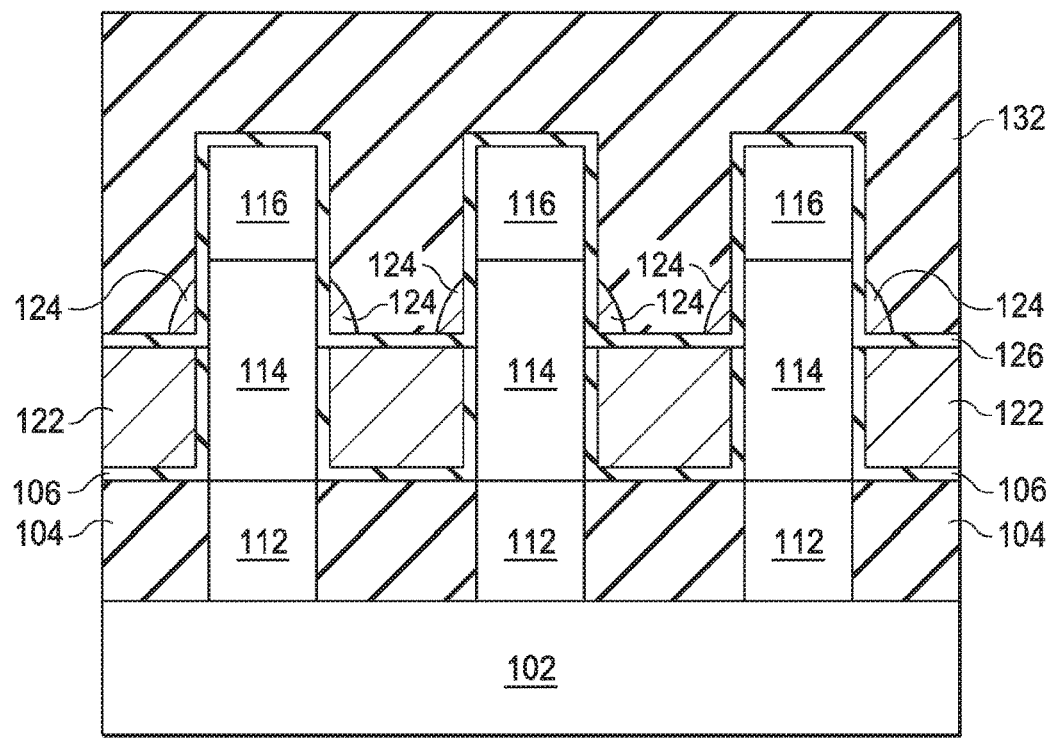

FIG. 18 illustrates a cross sectional view of the semiconductor device shown in FIG. 17 after an inter-layer dielectric layer is formed over the semiconductor device in accordance with various embodiments of the present disclosure. The inter-layer dielectric layer 132 may comprise doped or undoped silicon oxide, although other materials such as silicon nitride doped silicate glass, high-k materials, combinations of these, and/or the like, may alternatively be utilized. The inter-layer dielectric layer 132 may be formed by suitable fabrication techniques such as CVD and/or the like.

Figure 19:
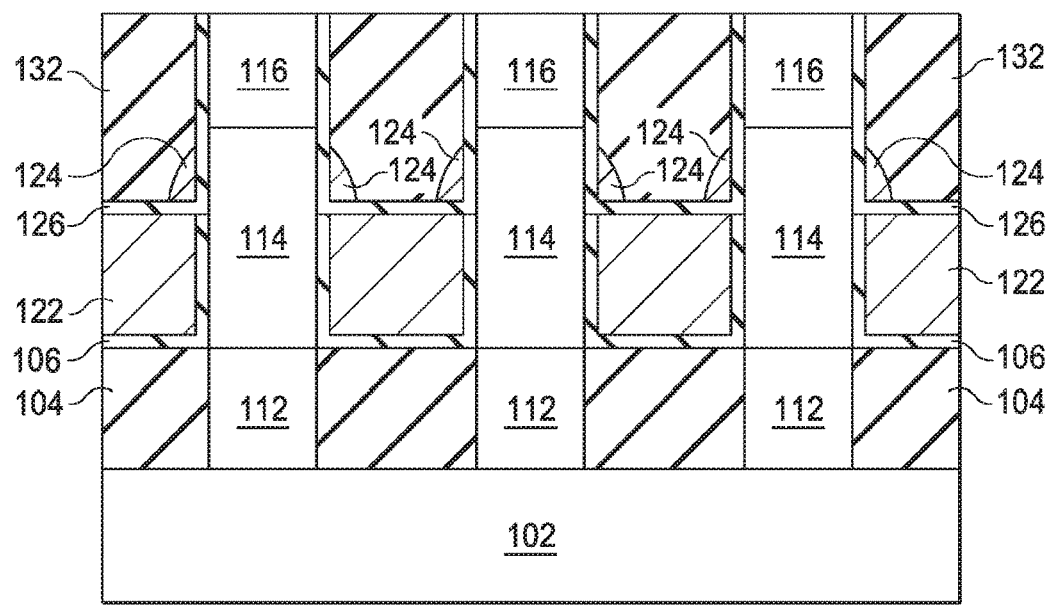

FIG. 19 illustrates a cross sectional view of the semiconductor device shown in FIG. 18 after a chemical mechanical polish (CMP) process is applied to the semiconductor device in accordance with various embodiments of the present disclosure. A planarization process such as a CMP process may be applied to the top surface of the semiconductor device. In the CMP process, a combination of etching materials and abrading materials are put into contact with the top side of the semiconductor device and a grinding pad (not shown) is used to grind away the inter-layer dielectric layer 132 until the top surfaces of the second drain/source regions 116 are exposed.

Figure 20:
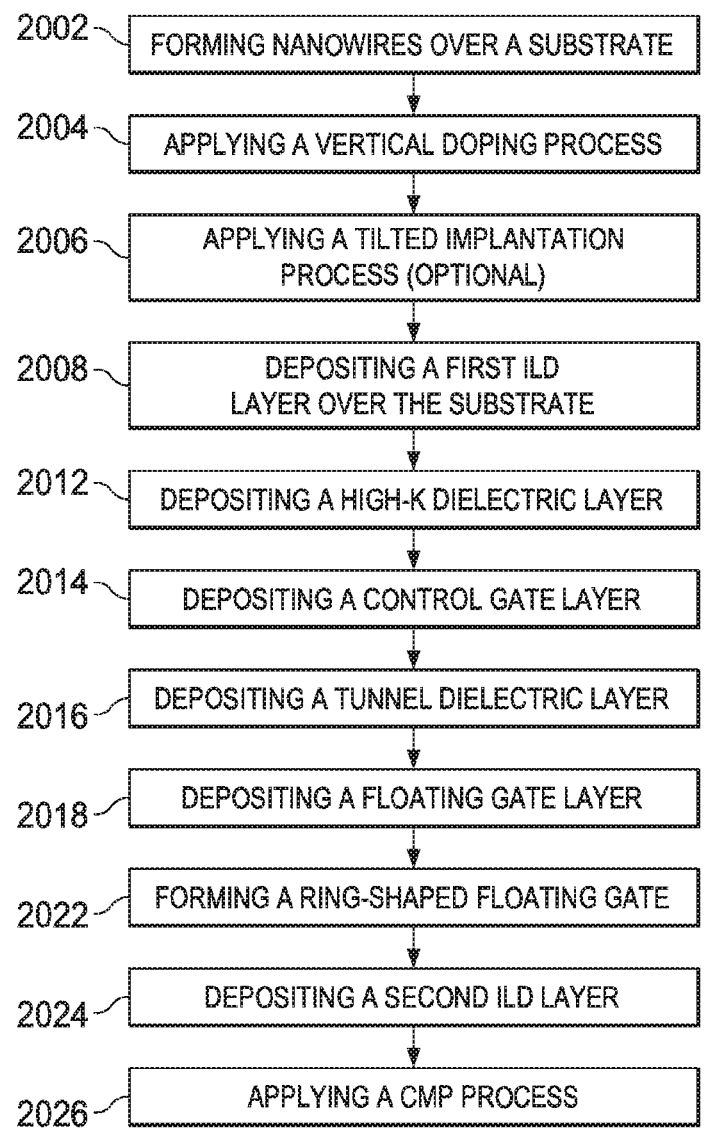
FIG. 20 illustrates a flow chart of a method for forming the memory device 100 shown in FIG. 1 in accordance with various embodiments of the present disclosure.

FIG. 20 illustrates a flow chart of a method for forming the memory device 100 shown in FIG. 1 in accordance with various embodiments of the present disclosure. This flowchart is merely an example, which should not unduly limit the scope of the claims. One of ordinary skill in the art would recognize many variations, alternatives, and modifications. For example, various step as illustrated in FIG. 20 may added, removed, replaced, rearranged and repeated.

At step 2002, a plurality of nanowires may be formed over a substrate. At step 2004, first drain/source regions and second drain/source regions are formed through a doping process such as a vertical doping process. The first drain/source region may be a source region formed in a lower portion of a nanowire. The second drain/source region may be a drain region formed in an upper portion of the nanowire.

At step 2006, a channel region is formed by a suitable semiconductor implantation process such as a tilted or angled doping process. The channel region is located between the first drain/source region and the second drain/source region. It should be noted applying a tilted implantation process to the channel region is an optional step. In some embodiments, the channel region may be undoped. At step 2008, a first inter-layer dielectric layer is formed over the semiconductor device through suitable fabrication techniques such as CVD.

At step 2012, a high-k dielectric layer is formed along the sidewalls of the channel region through a suitable deposition process and over the top surface of the first inter-layer dielectric layer. At step 2014, a control gate layer is formed over the high-k dielectric layer through a suitable deposition process.

At step 2016, a tunneling layer is formed over the semiconductor device through a suitable process. At step 2018, a floating gate layer is formed over the semiconductor device through a suitable deposition process.

At step 2022, a ring-shaped floating gate is formed by applying an etching process to the floating gate layer. At step 2024, a second inter-layer dielectric layer is formed over the semiconductor device through suitable fabrication techniques such as CVD. At step 2026, a CMP process is applied to the second inter-layer dielectric layer until the top surfaces of the second drain/source regions are exposed.

FIGS. 21-24 illustrate intermediate steps of fabricating the flash memory device shown in FIG. 7 in accordance with various embodiments of the present disclosure. The fabrication steps of forming drain/source regions, channel regions and control gate regions of fabricating the flash memory device shown in FIG. 7 are similar to those of the flash memory device shown in FIG. 1, and hence are not discussed in further detail to avoid unnecessary repetition.

Figure 21:
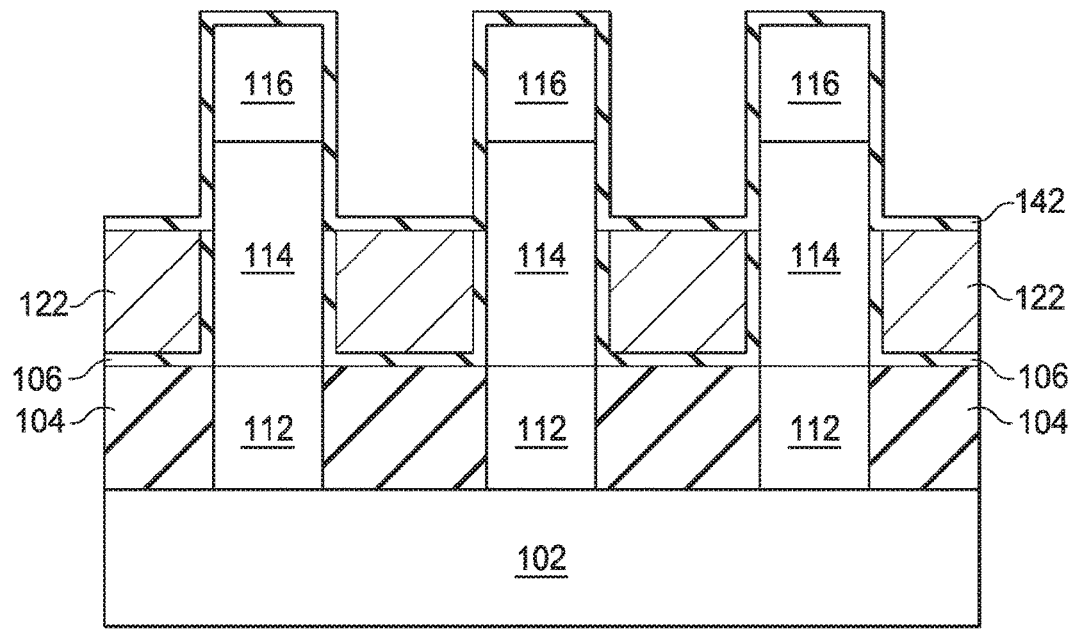
FIGS. 21-24 illustrate intermediate steps of fabricating the flash memory device shown in FIG. 7 in accordance with various embodiments of the present disclosure.
Figure 22:
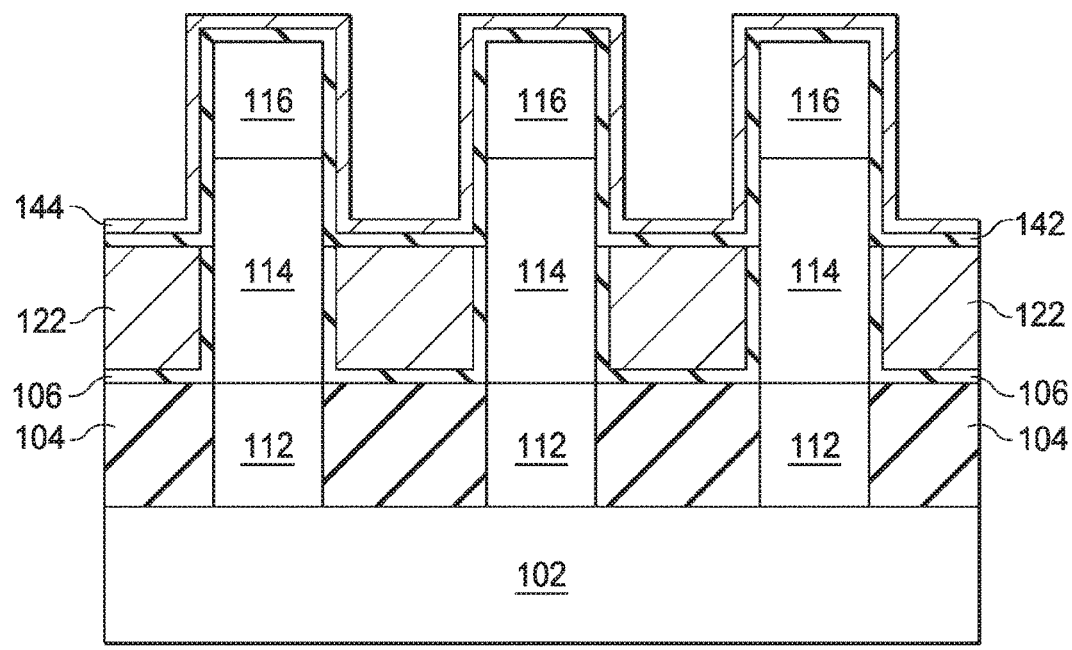
Figure 23:
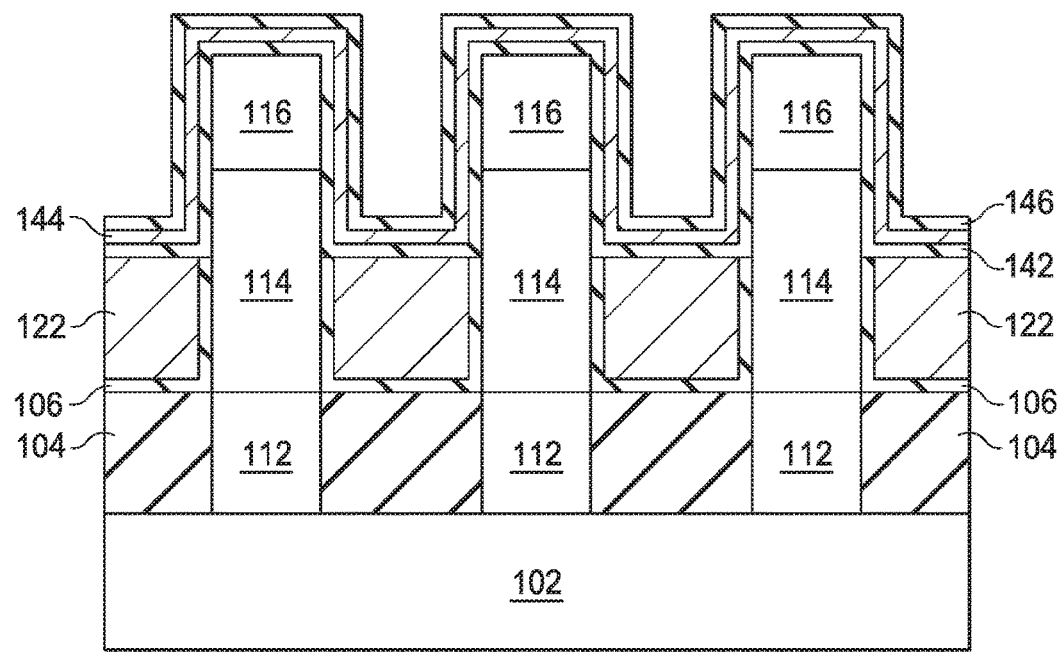

FIGS. 21-23 illustrate cross sectional views of a semiconductor device shown in FIG. 14 after an oxide-nitride-oxide (O—N—O) structure is formed over the semiconductor device in accordance with various embodiments of the present disclosure. The O—N—O structure includes a first oxide layer 142 shown in FIG. 21, a nitride layer 144 shown in FIG. 22 and a second oxide layer 146 shown in FIG. 23. As shown in FIG. 21, the first oxide layer 142 is deposited over the top surface of the control gate 122 as well as the surfaces of the protruding portions of the nanowires. In some embodiments, the first oxide layer 142 is of a thickness of about a few nanometers.

As shown in FIG. 22, the nitride layer 144 is formed over the first oxide layer 142. In some embodiments, the nitride layer 144 is of a thickness of about a few nanometers. The nitride layer 144 may be formed by using any suitable deposition techniques such as CVD, PECVD and/or the like.

As shown in FIG. 23, the second oxide layer 146 is deposited over the top surface of the nitride layer 144 through suitable semiconductor deposition techniques. In some embodiments, the second oxide layer 146 is of a thickness of about a few nanometers.

Figure 24:
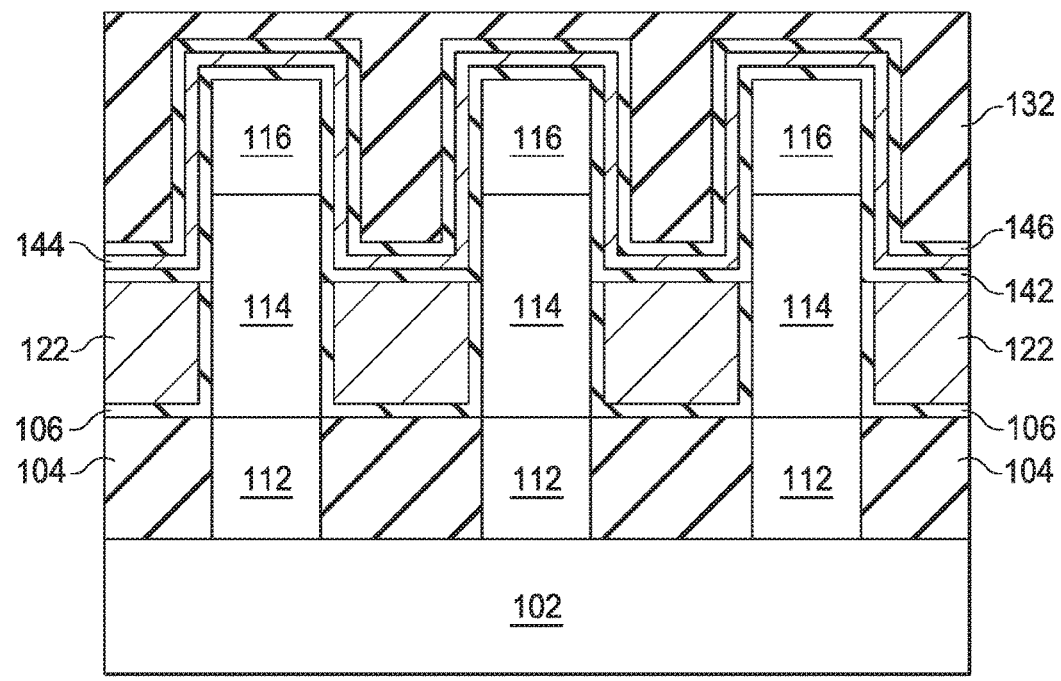

FIG. 24 illustrates a cross sectional view of the semiconductor device shown in FIG. 23 after an inter-layer dielectric layer is formed over the semiconductor device in accordance with various embodiments of the present disclosure. The inter-layer dielectric layer 132 may comprise doped or undoped silicon oxide, although other materials such as silicon nitride doped silicate glass, high-k materials, combinations of these, and/or the like, may alternatively be utilized. The inter-layer dielectric layer 132 may be formed by suitable fabrication techniques such as CVD and/or the like. A CMP process may be employed to remove the O—N—O structure from the top of the nanowires.

Figure 25:
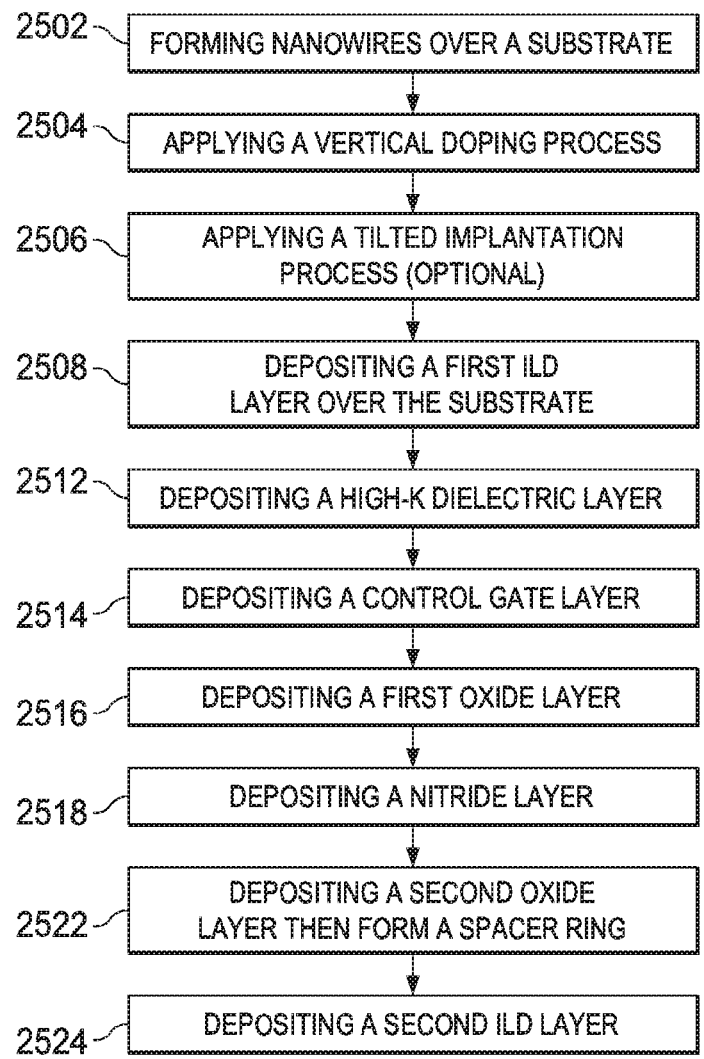
FIG. 25 illustrates a flow chart of a method for forming the memory device 700 shown in FIG. 7 in accordance with various embodiments of the present disclosure.

FIG. 25 illustrates a flow chart of a method for forming the memory device 700 shown in FIG. 7 in accordance with various embodiments of the present disclosure. This flowchart is merely an example, which should not unduly limit the scope of the claims. One of ordinary skill in the art would recognize many variations, alternatives, and modifications. For example, various step as illustrated in FIG. 25 may added, removed, replaced, rearranged and repeated.

The steps 2502-2514 shown in FIG. 25 are similar to the steps 2012-2014 shown 20, and hence are not discussed herein to avoid repetition. At step 2516, a first oxide layer is deposited over the top surface of the control gate as well as the surfaces of the protruding portions of the nanowires. At step 2518, a nitride layer is formed over the first oxide layer. At step 2522, a second oxide layer is deposited over the top surface of the silicon nitride layer through suitable semiconductor deposition techniques. The first oxide layer, the nitride layer and the second oxide layer may be patterned to form a spacer ring surrounding the upper portion of the channel region in accordance with some embodiments. At step 2524, a second inter-layer dielectric layer is formed over the semiconductor device through suitable fabrication techniques such as CVD and/or the like.

Figure 26:
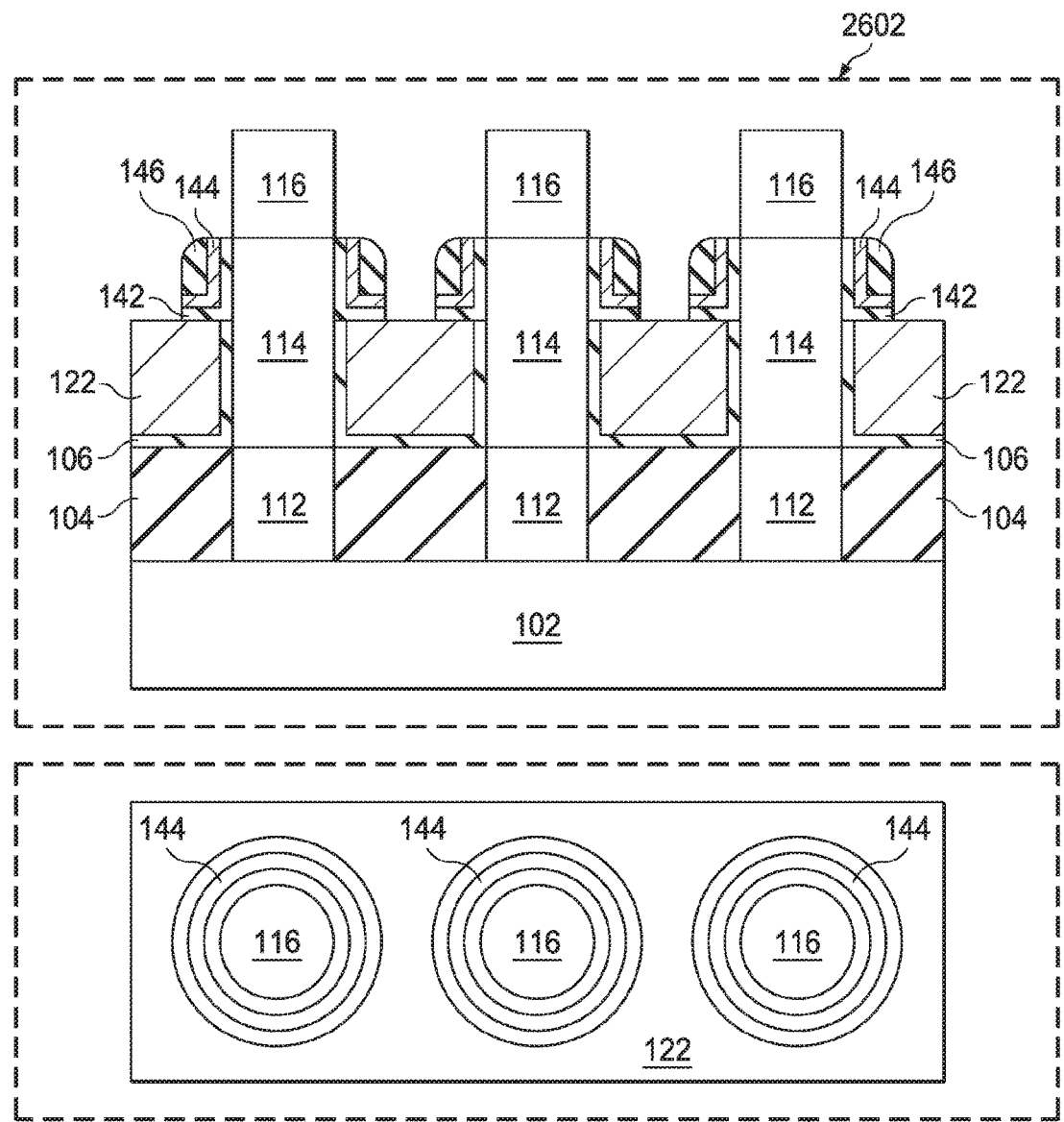
FIGS. 26-28 illustrate intermediate steps of fabricating the flash memory device shown in FIG. 8 in accordance with various embodiments of the present disclosure.
Figure 27:
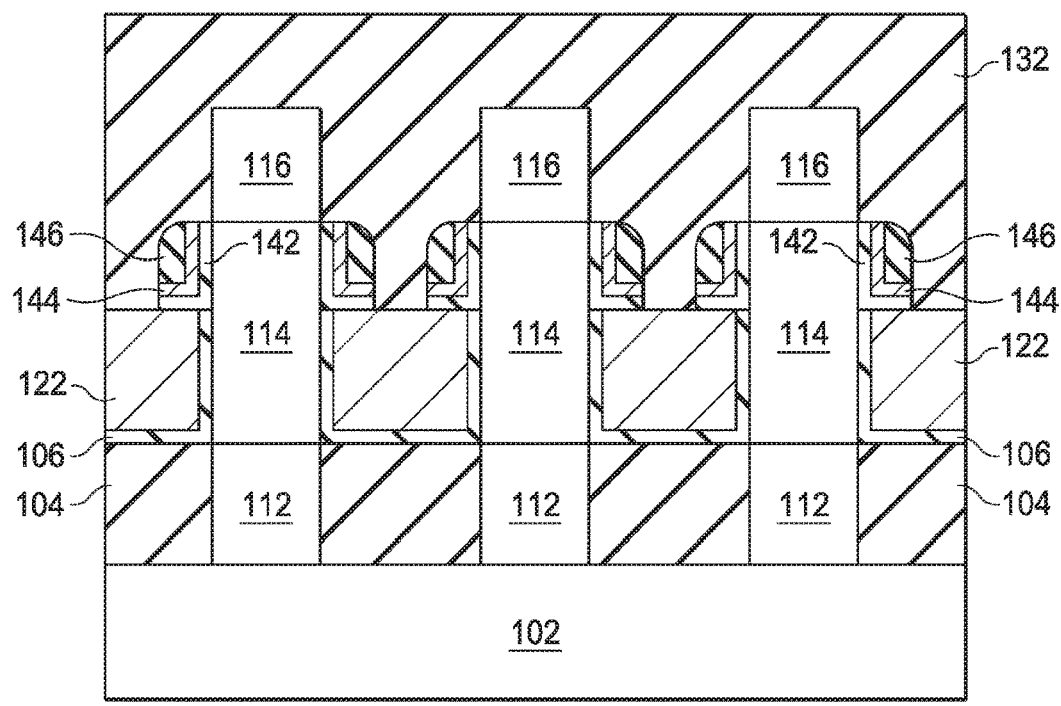
Figure 28:
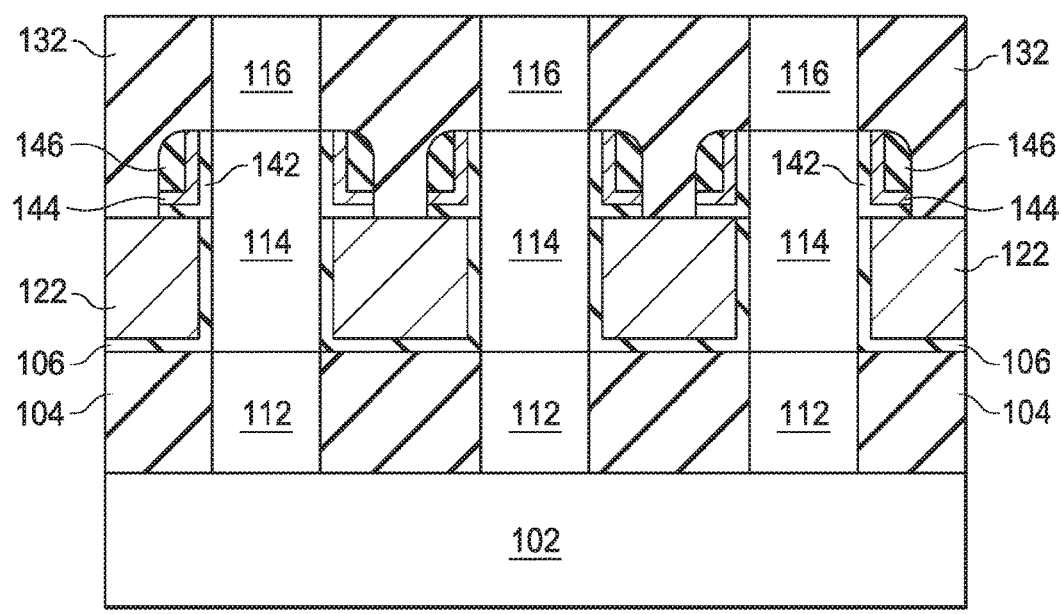

FIGS. 26-28 illustrate intermediate steps of fabricating the flash memory device shown in FIG. 8 in accordance with various embodiments of the present disclosure. The fabrication steps of forming the O—N—O structure of the flash memory device shown in FIG. 8 are similar to those of the flash memory device shown in FIG. 7, and hence are not discussed in further detail to avoid unnecessary repetition.

FIG. 26 illustrates the semiconductor device shown in FIG. 23 after an etching process is applied to the floating gate layer in accordance with various embodiments of the present disclosure. An etching process is applied to the first oxide layer 142, the nitride layer 144 and the second oxide layer 146. By controlling the strength and direction of the etching process, portions of the first oxide layer 142, the nitride layer 144 and the second oxide layer 146 have been removed as shown in a cross sectional view 2602 of the semiconductor device.

As shown in FIG. 26, after the etching process finishes, there may be three resulting O—N—O floating gates. As shown in FIG. 26, the O—N—O floating gates are formed along sidewalls of the upper portions of the channel regions 114. The O—N—O floating gates are of a ring shape as shown in a top view 2604 of the semiconductor device.

FIG. 27 illustrates a cross sectional view of the semiconductor device shown in FIG. 26 after an inter-layer dielectric layer is formed over the semiconductor device in accordance with various embodiments of the present disclosure. The inter-layer dielectric layer 132 may comprise doped or undoped silicon oxide, although other materials such as silicon nitride doped silicate glass, high-k materials, combinations of these, and/or the like, may alternatively be utilized. The inter-layer dielectric layer 132 may be formed by suitable fabrication techniques such as CVD and/or the like.

FIG. 28 illustrates a cross sectional view of the semiconductor device shown in FIG. 27 after a CMP process is applied to the semiconductor device in accordance with various embodiments of the present disclosure. A planarization process such as a CMP process may be applied to the top surface of the semiconductor device. In the CMP process, a combination of etching materials and abrading materials are put into contact with the top side of the semiconductor device and a grinding pad (not shown) is used to grind away the inter-layer dielectric layer 132 until the top surfaces of the second drain/source regions 116 are exposed as shown in FIG. 28.

Figure 29:
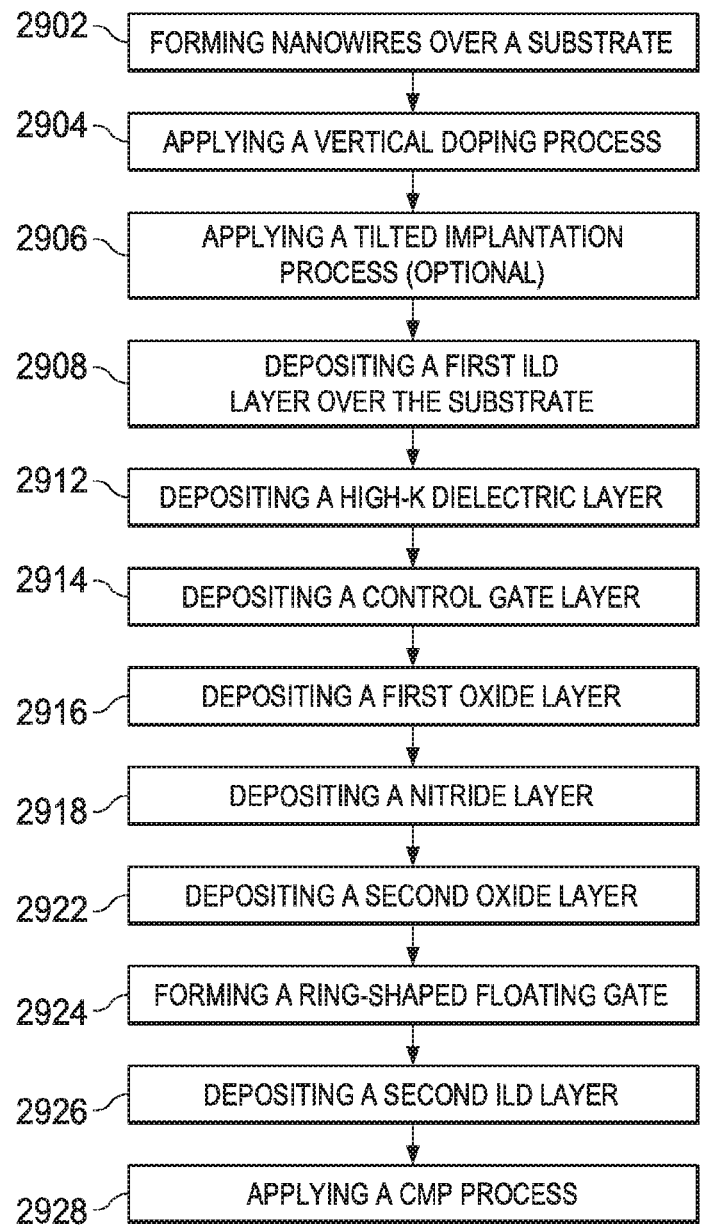
FIG. 29 illustrates a flow chart of a method for forming the memory device 800 shown in FIG. 8 in accordance with various embodiments of the present disclosure.

FIG. 29 illustrates a flow chart of a method for forming the memory device 800 shown in FIG. 8 in accordance with various embodiments of the present disclosure. This flow-chart is merely an example, which should not unduly limit the scope of the claims. One of ordinary skill in the art would recognize many variations, alternatives, and modifications. For example, various step as illustrated in FIG. 29 may added, removed, replaced, rearranged and repeated.

The steps 2902-2922 shown in FIG. 9 are similar to the steps 2502-2522 shown in FIG. 25, and hence are not discussed herein to avoid repetition. At step 2924, a ring-shaped O—N—O floating gate is formed by applying an etching process to the floating gate layer. At step 2926, a second inter-layer dielectric layer is formed over the semiconductor device through suitable fabrication techniques such as CVD and/or the like. At step 2928, a CMP process is applied to the second inter-layer dielectric layer until the top surfaces of the second drain/source regions are exposed.

In accordance with an embodiment, a method comprises patterning a substrate to form a nanowire over the substrate, applying a plurality of doping processes to the nanowire to form a first drain/source region at a lower portion of the nanowire, a second drain/source region at an upper portion of the nanowire and a channel region, wherein the channel region is between the first drain/source region and the second drain/source region, depositing a first dielectric layer along sidewalls of the channel region, depositing a control gate layer over the first dielectric layer, wherein the control gate layer surrounds a lower portion of the channel region, depositing a second dielectric layer along the sidewalls of the channel region and over the control gate layer and forming a floating gate region surrounding an upper portion of the channel region.

In accordance with an embodiment, a method comprises forming a nanowire over a substrate, applying a plurality of doping processes to the nanowire to form a first drain/source region at a lower portion of the nanowire, a second drain/source region at an upper portion of the nanowire and a channel region between the first drain/source region and the second drain/source region, depositing a first dielectric layer over the substrate, depositing a first gate dielectric layer along sidewalls of the channel region and over the first dielectric layer, depositing a control gate layer over the first dielectric layer, wherein a top surface the control gate layer is lower than a top surface of the channel region, depositing a second gate dielectric layer along the sidewalls of the channel region and over the control gate layer and forming a ring-shaped floating gate region surrounding an upper portion of the channel region.

In accordance with an embodiment, a method comprises patterning a substrate to form a nanowire over a substrate, forming a first drain/source region at a lower portion of the nanowire using a first doping process, forming a second drain/source region at an upper portion of the nanowire using a second doping process, forming a channel region using a third doping process, wherein the channel region is between the first drain/source region and the second drain/source region, forming a control gate region surrounding a lower portion of the channel region and forming a floating gate region surrounding an upper portion of the channel region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
patterning a substrate to form a nanowire over the substrate;
applying a plurality of doping processes to the nanowire to form a first drain/source region at a lower portion of the nanowire, a second drain/source region at an upper portion of the nanowire and a channel region, wherein the channel region is between the first drain/source region and the second drain/source region;
depositing a first dielectric layer along sidewalls of the channel region;
depositing a control gate layer over the first dielectric layer, wherein the control gate layer surrounds a lower portion of the channel region;
depositing a second dielectric layer along the sidewalls of the channel region and over the control gate layer; and
forming a floating gate region surrounding an upper portion of the channel region.

2. The method of claim 1, further comprising:
depositing a first inter-layer dielectric layer over the substrate, wherein the first inter-layer dielectric layer is between and in contact with the substrate and the first dielectric layer.

3. The method of claim 1, wherein:
the first drain/source region is a source; and
the second drain/source region is a drain.

4. The method of claim 1, further comprising:
forming the channel region through a tilted doping process.

5. The method of claim 1, wherein:
the floating gate region is a ring-shaped region from a top view, and wherein a top surface of the floating gate region is lower than a bottom surface of the second drain/source region.

6. The method of claim 1, wherein:
the second dielectric layer is a tunneling layer, and wherein the floating gate region and the upper portion of the channel region are separated by the tunneling layer.

7. The method of claim 1, wherein:
forming the floating gate region surrounding the upper portion of the channel region comprises depositing a floating gate layer over the nanowire and applying an etching process to the floating gate layer to form the floating gate region.

8. A method comprising:
forming a nanowire over a substrate;
applying a plurality of doping processes to the nanowire to form a first drain/source region at a lower portion of the nanowire, a second drain/source region at an upper portion of the nanowire and a channel region between the first drain/source region and the second drain/source region;
depositing a first dielectric layer over the substrate;
depositing a first gate dielectric layer along sidewalls of the channel region and over the first dielectric layer;
depositing a control gate layer over the first dielectric layer, wherein a top surface the control gate layer is lower than a top surface of the channel region;
depositing a second gate dielectric layer along the sidewalls of the channel region and over the control gate layer; and
forming a ring-shaped floating gate region surrounding an upper portion of the channel region.

9. The method of claim 8, wherein:
the first drain/source region is a source region of a flash memory transistor; and
the second drain/source region is a drain region of the flash memory transistor.

10. The method of claim 8, wherein:
forming the nanowire over the substrate comprises patterning the substrate and etching away an upper portion of the substrate.

11. The method of claim 8, wherein:
forming the nanowire over the substrate comprises forming a mask layer over the substrate, forming an opening in the mask layer, performing an epitaxial process to grow a semiconductor material in the opening and removing the mask layer for form the nanowire.

12. The method of claim 8, wherein:
the ring-shaped floating gate region comprises a first oxide layer, a nitride layer and a second oxide layer.

13. The method of claim 8, further comprising:
after forming the ring-shaped floating gate region, depositing a second dielectric layer over the substrate, wherein the ring-shaped floating gate region is embedded in the second dielectric layer.

14. The method of claim 13, further comprising:
applying a chemical mechanical polish process to the second dielectric layer until a top surface of the second drain/source region is exposed.

15. A method comprising:
patterning a substrate to form a nanowire over a substrate;
forming a first drain/source region at a lower portion of the nanowire using a first doping process;
forming a second drain/source region at an upper portion of the nanowire using a second doping process;
forming a channel region using a third doping process, wherein the channel region is between the first drain/source region and the second drain/source region;
forming a control gate region surrounding a lower portion of the channel region; and
forming a floating gate region surrounding an upper portion of the channel region.

16. The method of claim 15, further comprising:
forming a high-k dielectric layer, wherein:
the lower portion of the channel region is surrounded by the high-k dielectric layer; and
the high-k dielectric layer is surrounded by the control gate region.

17. The method of claim 15, further comprising:
forming a tunneling layer, wherein the floating gate region and the upper portion of the channel region are separated by the tunneling layer.

18. The method of claim 15, wherein:
the floating gate region is a ring-shaped region surrounding the nanowire from a top view.

19. The method of claim 15, wherein:
the floating gate region is an O—N—O gate region surrounding the upper portion of the channel region, wherein the O—N—O gate region comprises a first oxide layer, a nitride layer and a second oxide layer.

20. The method of claim 19, further comprising:
patterning the O—N—O gate region to form a ring-shaped O—N—O gate region surrounding the upper portion of the channel region.

* * * * *